(12) United States Patent
Lee et al.

(10) Patent No.: US 9,324,859 B2
(45) Date of Patent: Apr. 26, 2016

(54) SEMICONDUCTOR DEVICE AND METHOD OF FORMING THE SAME

(71) Applicant: Samsung Electronics Co., Ltd., Suwon-si (KR)

(72) Inventors: Heon-Bok Lee, Suwon-si (KR); In-Ho Yeo, Seoul (KR); Sae-Choon Oh, Seoul (KR); Suk-Kyun Lee, Yongin-si (KR); Jung-Ho Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/515,783

(22) Filed: Oct. 16, 2014

(65) Prior Publication Data

US 2015/0295080 A1    Oct. 15, 2015

(30) Foreign Application Priority Data

Apr. 10, 2014  (KR) ................. 10-2014-0043086

(51) Int. Cl.

| H01L 21/30 | (2006.01) |
|---|---|
| H01L 29/78 | (2006.01) |
| H01L 29/66 | (2006.01) |
| H01L 29/40 | (2006.01) |
| H01L 29/423 | (2006.01) |
| H01L 21/306 | (2006.01) |
| H01L 21/308 | (2006.01) |
| H01L 21/3213 | (2006.01) |
| H01L 21/265 | (2006.01) |
| H01L 21/311 | (2006.01) |

(52) U.S. Cl.
CPC ...... *H01L 29/7813* (2013.01); *H01L 21/26586* (2013.01); *H01L 21/308* (2013.01); *H01L 21/30604* (2013.01); *H01L 21/31111* (2013.01); *H01L 21/32133* (2013.01); *H01L 29/407* (2013.01); *H01L 29/4236* (2013.01); *H01L 29/66734* (2013.01)

(58) Field of Classification Search
CPC ............. H01L 29/7813; H01L 29/407; H01L 21/31111; H01L 21/26586; H01L 29/66734; H01L 21/30604; H01L 21/32133; H01L 21/308; H01L 29/4236
See application file for complete search history.

(56) References Cited

U.S. PATENT DOCUMENTS

| 7,915,672 | B2 | 3/2011 | Venkatraman | |
|---|---|---|---|---|
| 8,039,877 | B2 | 10/2011 | Ngai et al. | |
| 2006/0157779 | A1* | 7/2006 | Kachi | ............... H01L 29/66727 257/330 |
| 2007/0138544 | A1* | 6/2007 | Hirler | .................. H01L 29/407 257/330 |
| 2008/0090339 | A1 | 4/2008 | Herrick et al. | |
| 2008/0199995 | A1 | 8/2008 | Woolsey et al. | |
| 2010/0123187 | A1* | 5/2010 | Burke | .................. H01L 29/407 257/330 |
| 2011/0081773 | A1 | 4/2011 | Hunt | |
| 2012/0313161 | A1 | 12/2012 | Grivna et al. | |

* cited by examiner

*Primary Examiner* — Roy Potter
*Assistant Examiner* — Paul Patton
(74) *Attorney, Agent, or Firm* — Onello & Mello, LLP

(57) ABSTRACT

A split gate trench field effect transistor includes a gate electrode formed in a trench. A shield gate is formed in a trench below the gate electrode and surrounded by an insulating structure to float the shield electrode.

20 Claims, 44 Drawing Sheets

SEMICONDUCTOR DEVICE AND METHOD OF FORMING THE SAME

CROSS-REFERENCE TO RELATED APPLICATION

This application claims priority under 35 U.S.C. §119 to Korean Patent Application No. 10-2014-0043086 filed on Apr. 10, 2014, the disclosure of which is hereby incorporated by reference in its entirety.

BACKGROUND

1. Technical Field

Example embodiments in accordance with principles of inventive concepts relate to a semiconductor device, a method of forming the semiconductor device, and an electronic system including the same.

2. Description of Related Art

A power metal oxide semiconductor field-effect transistor (MOSFET) is often used in power supply sets or power conversion applications.

SUMMARY

In an example embodiment in accordance with principles of inventive concepts, a method of forming a semiconductor device includes forming a first mask pattern and a second mask pattern, which are sequentially stacked on a semiconductor layer. Trench regions configured to define an active region are formed in the semiconductor layer by etching the semiconductor layer using the first and second mask patterns as etch masks. A lower insulating
I layer configured to cover the trench regions and the first and second mask patterns is formed. A conductive structure configured to partially fill the trench region is formed on the lower insulating layer. An upper insulating layer configured to fill the trench region is formed over a substrate having the conductive structure. A planarized upper insulating layer and a planarized lower insulating layer are formed by planarizing the upper insulating layer and the lower insulating layer until the first mask pattern is exposed. An upper insulating pattern and a lower insulating pattern are formed by etching the planarized upper insulating layer and the planarized lower insulating layer. The first mask pattern is removed. A gate dielectric layer and a gate electrode are formed on the lower and upper insulating patterns and in the trench region.

In an embodiment, the formation of the conductive structure may include forming a conductive layer on the lower insulating layer, forming a planarized conductive layer by planarizing the conductive layer until the lower insulating layer located on the second mask pattern is exposed, and etching the planarized conductive layer.

In an embodiment, the upper insulating pattern may be fanned to have a thickness greater than the lower insulating pattern.

In an embodiment, the lower insulating pattern and the upper insulating pattern may be formed to entirely surround the conductive structure.

In an embodiment, an example method of forming the semiconductor device may further include forming an insulating buffer layer on the active region and the gate electrode, forming a source impurity region in the active region by performing a slant ion implantation process, and forming a channel impurity region having a conductive type different from the source impurity region in the active region. The gate electrode may be formed at a lower level than an upper surface of the active region, the source impurity region may be formed at a higher level than the channel impurity region, and the channel impurity region may have a part facing the gate electrode.

In an embodiment, an example method of forming the semiconductor device may further include forming an insulating capping layer on the insulating buffer layer, forming a groove region, forming a body contact impurity region, and forming a front-side conductive layer configured to fill the groove region on the insulating capping layer.

In an embodiment, the groove region may pass through the insulating capping layer and the source impurity region, and be formed to extend into the channel impurity region. The body contact impurity region may be formed in a surface of the channel impurity region exposed by the groove region.

In an embodiment, before the gate dielectric layer is formed, an example method of forming the semiconductor device may further include forming a sacrificial oxide layer on a surface of the active region located at a higher level than the upper insulating pattern and the lower insulating pattern, and increasing a width of the trench region located at a higher level than the upper insulating pattern and the lower insulating pattern by removing the sacrificial oxide layer.

In an example embodiment in accordance with principles of inventive concepts, a method of forming a semiconductor device includes forming a first mask pattern and a second mask pattern, which are sequentially stacked on a semiconductor layer. Trench regions configured to define an active region are formed in the semiconductor layer by etching the semiconductor layer using the first and second mask patterns as etch masks. A lower insulating layer configured to cover the trench regions and the first and second mask patterns is formed. A lower conductive pattern configured to partially fill the trench region is formed on the lower insulating layer. The lower insulating layer located at a higher level than the lower conductive pattern is etched. An intermediate insulating layer is formed over a substrate having the lower conductive pattern and the etched lower insulating layer. An upper conductive pattern configured to partially fill the trench region is formed on the intermediate insulating layer. An upper insulating layer is formed over the substrate having the upper conductive pattern. A planarized upper insulating layer and a planarized lower insulating layer are formed by planarizing the upper insulating layer and the lower insulating layer until the first mask pattern is exposed. An upper insulating pattern and the lower insulating pattern are formed by etching the planarized upper insulating layer and the planarized lower insulating layer. The first mask pattern is removed. A gate dielectric layer and a gate electrode are formed on the lower and upper insulating patterns and in the trench region.

In an embodiment, the formation of the lower conductive pattern may include forming a lower conductive layer on the lower insulating layer, forming a planarized lower conductive layer by planarizing the lower conductive layer until the lower insulating layer located on the second mask pattern is exposed, and etching the planarized lower conductive layer.

In an embodiment, the second mask pattern may be etched and removed together with the lower insulating layer while etching the lower insulating layer.

In an embodiment, the formation of the upper conductive pattern may include forming an upper conductive layer on the intermediate insulating layer, forming a planarized upper conductive layer by planarizing the upper conductive layer until the intermediate insulating layer located on the first mask pattern is exposed, and etching the planarized upper conductive layer.

In an embodiment, before the lower insulating layer is etched, an example method of forming the semiconductor device may further include forming an auxiliary insulating layer configured to fill the trench region over the substrate having the lower conductive pattern, forming a planarized auxiliary insulating layer and a planarized lower insulating layer by planarizing the auxiliary insulating layer and the lower insulating layer until the first mask pattern is exposed, and forming an auxiliary insulating pattern and a lower insulating pattern by etching the planarized auxiliary insulating layer and the planarized lower insulating layer.

In an embodiment, a distance between the lower conductive pattern and the upper conductive pattern may be greater than a distance between a bottom of the lower conductive pattern and a bottom of the trench region, and a distance between the upper conductive pattern and the gate electrode.

In an embodiment, an example method of forming the semiconductor device may further include forming a source impurity region in the active region, and forming a channel impurity region in the active region under the source impurity region.

In an embodiment, an example method of forming the semiconductor device may further include forming an insulating capping layer over the substrate having the source impurity region and the channel impurity region, forming a groove region configured to pass through the insulating capping layer and source impurity region, and extend into the channel impurity region, forming a body contact impurity region in a surface of the channel impurity region exposed by the groove region, and forming a front-side conductive layer configured to fill the groove region on the insulating capping layer.

In an example embodiment in accordance with principles of inventive concepts, a split gate trench field effect transistor includes a gate electrode formed in a trench, a shield gate formed in a trench below the gate electrode and an insulating structure surrounding the shield gate and thereby floating the shield gate.

In an example embodiment in accordance with principles of inventive concepts, the distance between the bottom of the gate electrode and the top of the shield gate is greater than the distance between the bottom of the shield gate and the bottom of the trench in which it is fanned.

In an example embodiment in accordance with principles of inventive concepts, the shield gate includes upper and lower conductive patterns surrounded by an insulating structure.

In an example embodiment in accordance with principles of inventive concepts, a DC-to-DC converter includes a split gate trench field effect transistor that includes a gate electrode formed in a trench, a shield gate formed in a trench below the gate electrode and an insulating structure surrounding the shield gate and thereby floating the shield gate.

In an example embodiment in accordance with principles of inventive concepts, an electronic system includes a DC-to-DC converter that includes a split gate trench field effect transistor that includes a gate electrode formed in a trench, a shield gate formed in a trench below the gate electrode and an insulating structure surrounding the shield gate and thereby floating the shield gate.

BRIEF DESCRIPTION OF THE DRAWINGS

The foregoing and other features and advantages of inventive concepts will be apparent from the more particular description of embodiments of inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
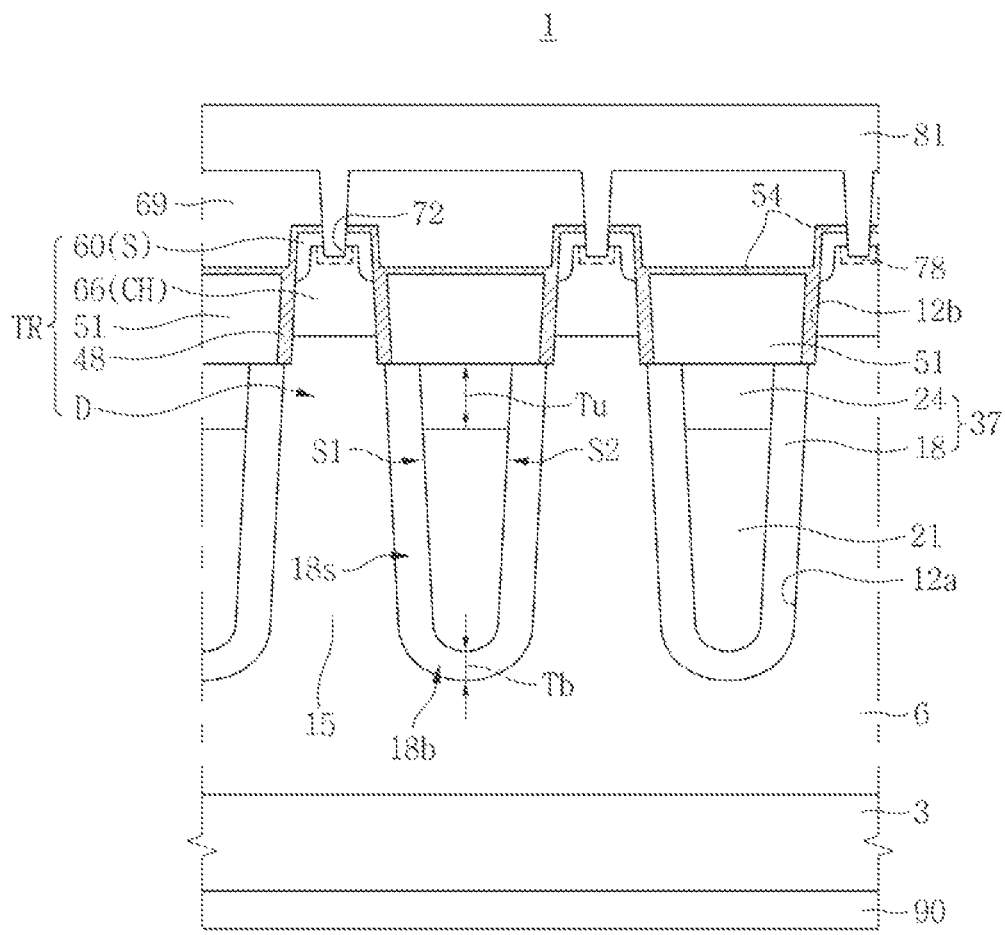
FIG. 1 is a cross-sectional view showing an example embodiment of a semiconductor device in accordance with principles of inventive concepts.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items and the term "or" is meant to be inclusive, unless otherwise indicated.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts. The thickness of layers may be exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Figure 2:
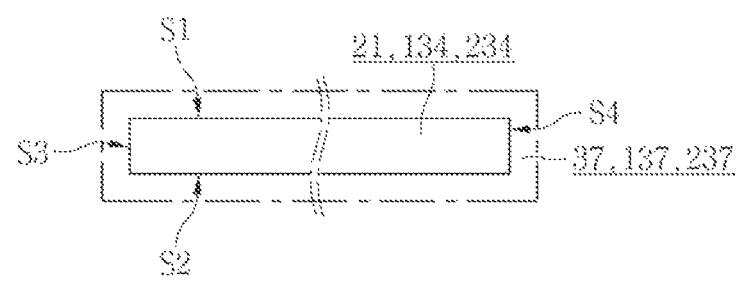
FIG. 2 is a top view showing some components of an example embodiment of a semiconductor device in accordance with principles of inventive concepts.
Figure 3:
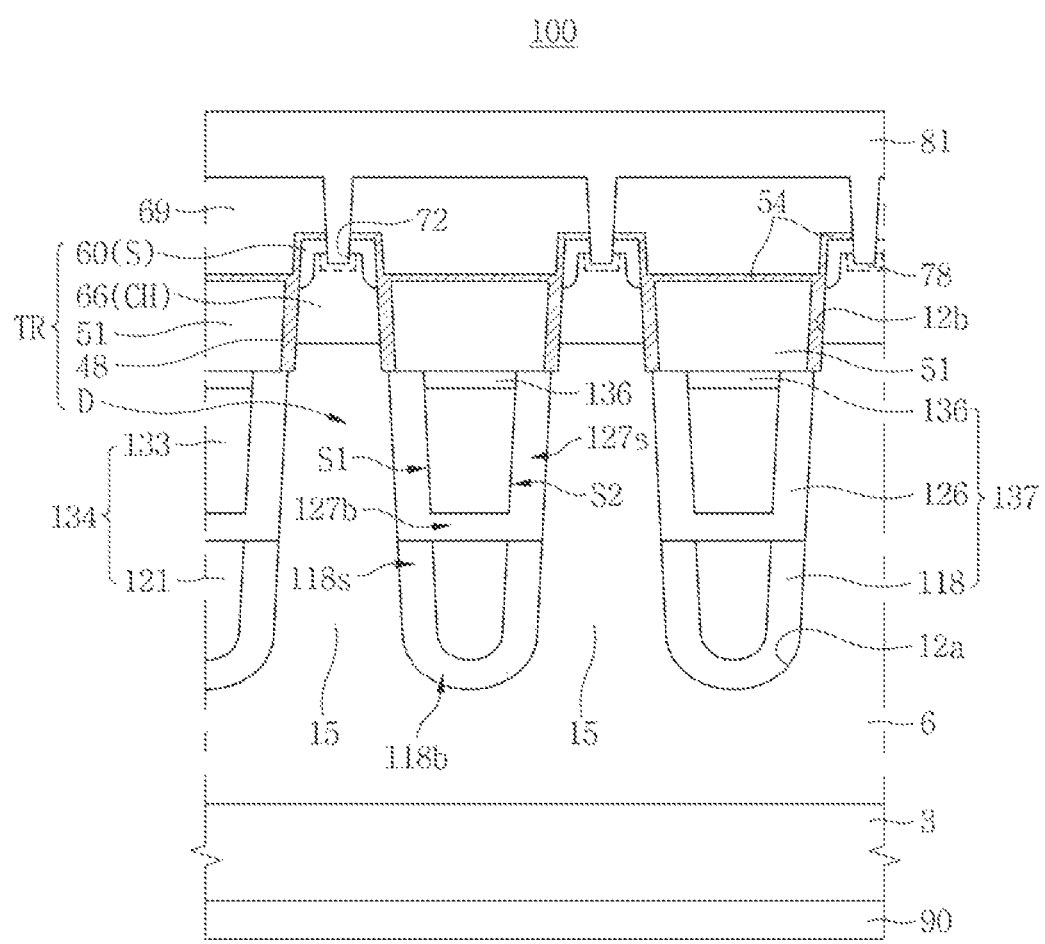
FIG. 3 is a cross-sectional view showing an example embodiment of a semiconductor device in accordance with principles of inventive concepts.
Figure 4:
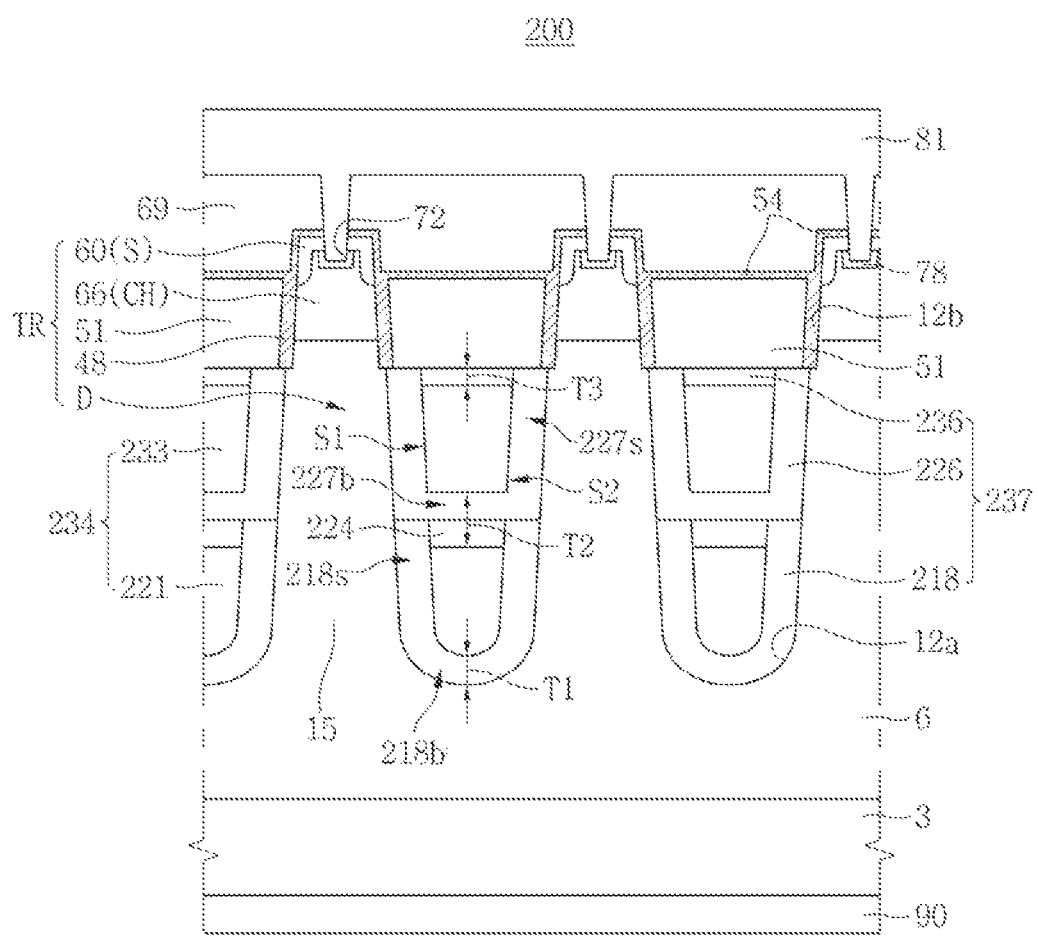
FIG. 4 is a cross-sectional view showing an example embodiment of a semiconductor device in accordance with principles of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein FIG. 1 is a cross-sectional view showing an example embodiment of a semiconductor device in accordance with principles of inventive concepts. FIG. 2 is a top view showing some components of an example embodiment of a semiconductor device in accordance with principles of inventive concepts. FIG. 3 is a cross-sectional view showing an example embodiment of a semiconductor device in accordance with principles of inventive concepts. FIG. 4 is a cross-sectional view showing an example embodiment of a semiconductor device in accordance with principles of inventive concepts.

First, the semiconductor device in accordance with the embodiment of the inventive concept will be described with reference to FIGS. 1 and 2.

Referring to FIGS. 1 and 2, the semiconductor device 1 in accordance with the embodiment of the inventive concept may include a semiconductor substrate 3, and a semiconductor layer 6 disposed on the semiconductor substrate 3.

The semiconductor layer 6 may include an epitaxial layer formed by an epitaxial process and may include a single-crystalline silicon layer. The semiconductor layer 6 may have the same conductivity type as the semiconductor substrate 3, and an impurity concentration lower than the semiconductor substrate 3. For example, the semiconductor layer 6 may have the same N-type conductivity as the semiconductor substrate 3, and an impurity concentration lower than the semiconductor substrate 3.

The semiconductor device 1 may include trench regions 12a and 12b disposed in the semiconductor layer 6, and configured to define an active region 15.

The trench regions 12a and 12b may include a first trench region 12a and a second trench region 12b. The first trench region 12a may have a sloped side wall which gradually widens from a lower part to an upper part.

The second trench region 12b may be disposed on the first trench region 12a, and may have a width greater than the first trench region 12a (the narrowest area of second trench region 12b may be wider than the widest area of first trench region 12a, for example).

The semiconductor device 1 may include a conductive structure 21, an insulating structure 37, a gate dielectric layer 48, and a gate electrode 51.

The conductive structure 21 and the insulating structure 37 may be disposed in the first trench region 12a, and the gate dielectric layer 48 and the gate electrode 51 may be disposed in the second trench region 12b.

The gate electrode 51 may be disposed on the insulating structure 37. The gate electrode 51 may have a width greater than the insulating structure 37. The gate dielectric layer 48 may be interposed between the gate electrode 51 and the active region 15.

The conductive structure 21 and the insulating structure 37 may fill the first trench region 12a. The conductive structure 21 may be disposed in the insulating structure 37. The conductive structure 21 may be entirely surrounded and isolated by the insulating structure 37. The conductive structure 21 may be electrically floating.

The insulating structure 37 may be disposed to entirely surround the conductive structure 21. The insulating structure 37 may entirely cover all sides, a lower surface, and an upper surface of the conductive structure 21. The insulating structure 37 may cover first and second sides S1 and S2 facing each other, third and fourth sides S3 and S4 facing each other, and the upper surface and the bottom of the conductive structure 21. Therefore, in example embodiments, the insulating structure 37 may be disposed to completely surround the conductive structure 21.

The insulating structure 37 may include a lower insulating pattern 18 and an upper insulating pattern 24. The upper insulating pattern 24 may be disposed between the conductive structure 21 and the gate electrode 51. The lower insulating pattern 18 may include a lower part 18b interposed between the conductive structure 21 and the semiconductor layer 6, and a side part 18s interposed between the conductive structure 21 and the semiconductor layer 6 and between the upper insulating pattern 24 and the semiconductor layer 6.

In the example embodiment of FIG. 1, a distance Tu between the conductive structure 21 and the gate electrode 51 may be greater than a distance Tb between a bottom of the conductive structure 21 and a bottom of the first trench region 12a. The distance Tu between the conductive structure 21 and the gate electrode 51 may be substantially equal to the thickness of the upper insulating pattern 24, for example. The distance Tb between the bottom of the conductive structure 21 and the bottom of the first trench region 12a may have substantially the same thickness as the lower part 18b of the lower insulating pattern 18 located under the conductive structure 21.

As the distance Tu between the conductive structure 21 and the gate electrode 51 is formed to be greater than the distance Tb between the bottom of the conductive structure 21 and the bottom of the trench region 12, performance of the semiconductor device may be improved. Additionally, as the conductive structure 21 is formed to be entirely surrounded by the insulating structure 37, the performance of the semiconductor device employing the conductive structure 21 may be improved as will be shown in an experimental result of FIG. 44 and as described in the discussion related thereto.

The semiconductor device 1 may include a groove region 72 disposed in an upper surface of the active region 15. Additionally, the semiconductor device 1 may include a channel impurity region 66, a source impurity region 60, and a body contact impurity region 78.

The channel impurity region 66, the source impurity region 60, and the body contact impurity region 78 may be disposed in the active region 15. The source impurity region 60 may be disposed on the channel impurity region 66, and in an upper area of the active region 15.

The groove region 72 may pass through the source impurity region 60, and extend into the channel impurity region 66, and, as a result, the bottom of the groove region 72 may be disposed at a lower level than the upper surface of the channel impurity region 66.

The body contact impurity region 78 may be disposed in the active region between the groove region 72 and the channel impurity region 66.

The semiconductor layer 6 may have a first conductivity type, the channel impurity region 66 and the body contact impurity region 78 may have a second conductivity type different from the first conductivity type, and the source impurity region 60 may have the first conductivity type. For example, the channel impurity region 66 and the body contact impurity region 78 may each have P-type conductivity, and the semiconductor layer 6 and the source impurity region 60 may each have N-type conductivity.

The semiconductor device 1 may include a transistor TR having a source area S, a channel area CH, a drain area D, the gate dielectric layer 48, and the gate electrode 51.

The channel impurity region 66 may be defined as the channel area CH. The source impurity region 60 may be defined as the source area S. The active region 15 located under the channel impurity region 66 may be defined as the drain area D.

The semiconductor device 1 may include an insulating buffer layer 54, an insulating capping layer 69, a front-side conductive layer 81, and a back-side conductive layer 90.

The insulating capping layer 69 may cover the active regions 15 on both sides of the groove region 72, and the gate electrode 51. The insulating buffer layer 54 may be interposed between the insulating capping layer 69 and the active region 15, and between the insulating capping layer 69 and the gate electrode 51. The front-side conductive layer 81 may pass through the insulating capping layer 69, fill the groove region 72, and cover the insulating capping layer 69. The front-side conductive layer 81 may form an ohmic contact with the body contact impurity region 78 and the source impurity region 60. The back-side conductive layer 90 may be disposed on a back side of the semiconductor substrate 3. The back-side conductive layer 90 may face the front-side conductive layer 81, in which the semiconductor substrate 3 is interposed therebetween. The front-side conductive layer 81 may include a source terminal of the transistor TR, and the back-side conductive layer 90 may include a drain terminal of the transistor TR.

In the example embodiment of FIG. 1, as the conductive structure 21 is formed to be entirely surrounded by the insulating structure 37, the conductive structure 21 may be electrically floating. As described above, as the conductive structure 21 is floating, an electric field on the bottom of the first trench region 12a may be reduced and, because the electric field on the bottom of the first trench region 12a may be reduced, performance of the transistor TR may be improved. Additionally, because the thickness of the lower insulating pattern 18 may be reduced without increasing the electric field on the bottom of the first trench region 12a, the size of the semiconductor device 1 may be reduced as much as the thickness of the lower insulating pattern 18 is reduced. In example embodiments gate electrode 51 is the gate of a split gate trench MOSFET and conductive structure 21 is a floating shield gate. As will be described in greater detail in the discussion related to FIG. 44, such a structure provides performance advantages, for example, in reduced "on" resistance.

Next, the example embodiment of a semiconductor device in accordance with principles of inventive concepts will be described with reference to FIGS. 2 and 3.

Referring to FIGS. 2 and 3, the example embodiment of semiconductor device 100 in accordance with principles of inventive concepts may include the semiconductor layer 6 disposed on the semiconductor substrate 3, the trench regions 12a and 12b disposed in the semiconductor layer 6 and configured to define the active region 15, the transistor TR, the insulating buffer layer 54, the insulating capping layer 69, the front-side conductive layer 81, and the back-side conductive layer 90 such as described in FIG. 1.

The semiconductor device 100 may include a conductive structure 134 and an insulating structure 137, which are disposed in the first trench region 12a of the trench regions 12a and 12b.

The conductive structure 134 may include a lower conductive pattern 121 and an upper conductive pattern 133. The upper conductive pattern 133 may be disposed on the lower conductive pattern 121, and spaced apart from the lower conductive pattern 121, for example.

The insulating structure 137 may be configured to entirely surround the conductive structure 134. The insulating structure 137 may be configured to completely cover a bottom, an upper surface, and sides S1, S2, S3, and S4 of the conductive structure 134.

Because, in accordance with principles of inventive concepts, the conductive structure 134 is formed to be entirely surrounded by the insulating structure 137, and the conductive structure 134 is electrically floating, performance of the semiconductor device 100 employing the conductive structure 134 may be improved.

In accordance with principles of inventive concepts, insulating structure 137 may include a lower insulating pattern 118, an intermediate insulating pattern 127, and an upper insulating pattern 136.

The lower insulating pattern 118 may include a lower part 118b interposed between a bottom of the lower conductive pattern 121 and the semiconductor layer 6, and a side part 118s interposed between sides of the lower conductive pattern 121 and the semiconductor layer 6.

The intermediate insulating pattern 127 may include a lower part 127b interposed between the lower conductive pattern 121 and the upper conductive pattern 133, and a side part 127s interposed between the upper conductive pattern 133 and the semiconductor layer 6, and between the upper insulating pattern 136 and the semiconductor layer 6.

The upper insulating pattern 136 may be interposed between the upper conductive pattern 133 and the gate electrode 51.

Next, the example embodiment of a semiconductor device in accordance with principles of inventive concepts will be described with reference to FIGS. 2 and 4.

Referring to FIGS. 2 and 4, an example embodiment of a semiconductor device 200 in accordance with principles of inventive concepts may include the semiconductor layer 6 disposed on the semiconductor substrate 3, the trench regions 12a and 12b disposed in the semiconductor layer 6 and configured to define the active region 15, the transistor TR, the insulating buffer layer 54, the insulating capping layer 69, the front-side conductive layer 81, and the back-side conductive layer 90 as described in FIG. 1.

The semiconductor device 200 may include a conductive structure 234 and an insulating structure 237, which are disposed in the first trench region 12a of the trench regions 12a and 12b.

The conductive structure 234 may include a lower conductive pattern 221, and an upper conductive pattern 233 disposed on the lower conductive pattern 221.

The insulating structure 237 may be configured to entirely surround the conductive structure 234. The insulating structure 237 may be configured to completely cover a bottom, an upper surface, and sides S1, S2, S3, and S4 of the conductive structure 234. Because, in accordance with principles of inventive concepts, the conductive structure 234 is foamed to be entirely surrounded by the insulating structure 237, and the conductive structure 234 is electrically floating, performance of the semiconductor device 200 employing the conductive structure 234 may be improved.

The insulating structure 237 may include a lower insulating pattern 218, an auxiliary insulating pattern 224, an intermediate insulating pattern 227, and an upper insulating pattern 236.

The auxiliary insulating pattern 224 may be disposed between the lower conductive pattern 221 and the upper conductive pattern 233. The auxiliary insulating pattern 224 may contact an upper surface of the lower conductive pattern 221. The upper insulating pattern 236 may be disposed between the upper conductive pattern 233 and the gate electrode 51.

The lower insulating pattern 218 may include a lower part 218b interposed between a bottom of the lower conductive pattern 221 and the semiconductor layer 6, and a side part 218s interposed between sides of the lower conductive pattern 221 and the semiconductor layer 6, and between sides of the auxiliary insulating pattern 224 and the semiconductor layer 6.

The intermediate insulating pattern 227 may include a lower part 227b interposed between the auxiliary insulating pattern 224 and the upper conductive pattern 233, and a side part 227s interposed between the upper conductive pattern 233 and the semiconductor layer 6, and between the upper insulating pattern 236 and the semiconductor layer 6.

The lower part 218b of the lower insulating pattern 218 may be disposed between the lower conductive pattern 221 and the bottom of the first trench region 12a. The auxiliary insulating pattern 224 and the lower part 227b of the intermediate insulating pattern 227 may be disposed between the upper conductive pattern 233 and the lower conductive pattern 221. The upper insulating pattern 236 may be disposed between the gate electrode 51 and the upper conductive pattern 233.

In an example embodiment, the distance T2 between the upper conductive pattern 233 and the lower conductive pattern 221 may be greater than the distance T1 between the lower conductive pattern 221 and the bottom of the first trench region 12a, and the distance T3 between the gate electrode 51 and the upper conductive pattern 233. In accordance with principles of inventive concepts, because the distance T2 between the upper conductive pattern 233 and the lower conductive pattern 221 is greater, electric fields formed in the semiconductor layer 6 adjacent to the bottom of the lower insulating pattern 218, and/or in the drain area D adjacent to the gate electrode 51 may be weakened. Because, in accordance with principles of inventive concepts, the electric fields, which are formed in the semiconductor layer 6 adjacent to the bottom of the lower insulating pattern 218, and in the drain area D adjacent to the gate electrode 51, are minimized, performance of the semiconductor device 200 may be improved.

Hereinafter, example embodiments of methods of forming semiconductor devices in accordance with principles of inventive concepts will be described.

FIGS. 5 to 25 are cross-sectional views showing an example method of forming an example embodiment of a semiconductor device in accordance with principles of inventive concepts. FIGS. 26 to 34 are cross-sectional views showing an example method of forming an example embodiment of a semiconductor device in accordance with principles of inventive concepts. FIGS. 35 to 43 are cross-sectional views showing an example method of forming an example embodiment of a semiconductor device in accordance with principles of inventive concepts.

An example method of forming a semiconductor device in accordance with principles of inventive concepts will be described with reference to FIGS. 5 to 25.

Figure 5:
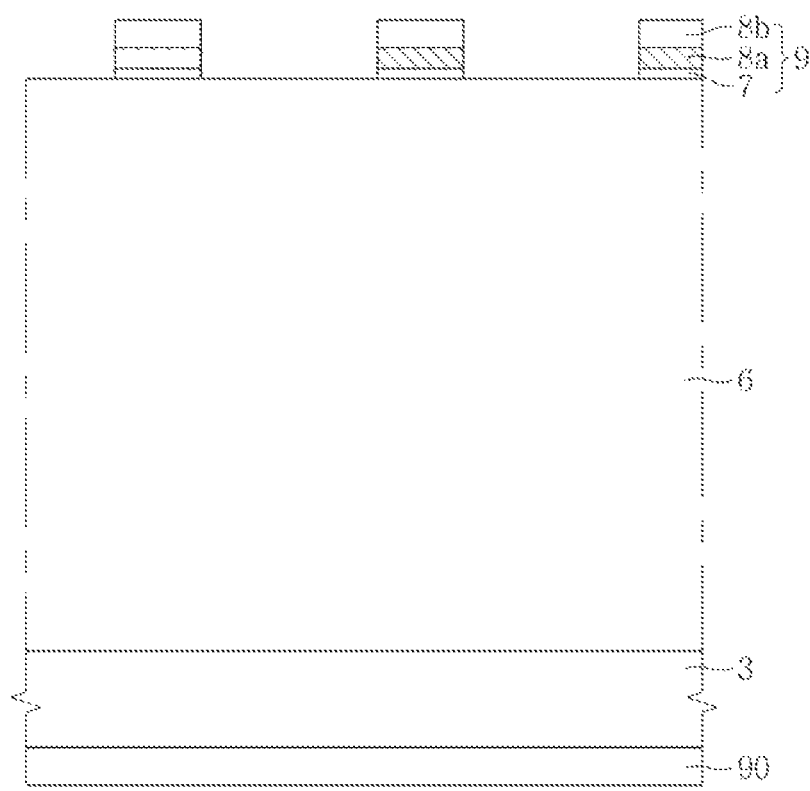
FIGS. 5 to 25 are cross-sectional views showing a method of forming an example embodiment of a semiconductor device in accordance with principles of inventive concepts.

Referring to FIG. 5, an example method of forming a semiconductor device in accordance with principles of inventive concepts may include forming a semiconductor layer 6 on a semiconductor substrate 3, and forming a mask pattern 9 on the semiconductor layer 6.

The semiconductor substrate 3 may have a first conductivity type. For example, the semiconductor substrate 3 may have an N-type silicon semiconductor wafer. The semiconductor layer 6 may be formed as a single layer using an epitaxial growth process and may be formed to have the same conductivity type as the semiconductor substrate 3, and an impurity concentration lower than the semiconductor substrate 3. For example, when the semiconductor substrate 3 has N-type conductivity, the semiconductor layer 6 may have the same N-type conductivity as the semiconductor substrate 3, and an N-type impurity concentration lower than the semiconductor substrate 3.

The formation of the mask pattern 9 may include forming a buffer pattern 7, a first mask pattern 8a, and a second mask pattern 8b, which are sequentially stacked. The buffer pattern 7 may be formed of silicon oxide. The first mask pattern 8a may be formed of silicon nitride and the second mask pattern 8b may be formed of silicon oxide, for example.

Figure 6:
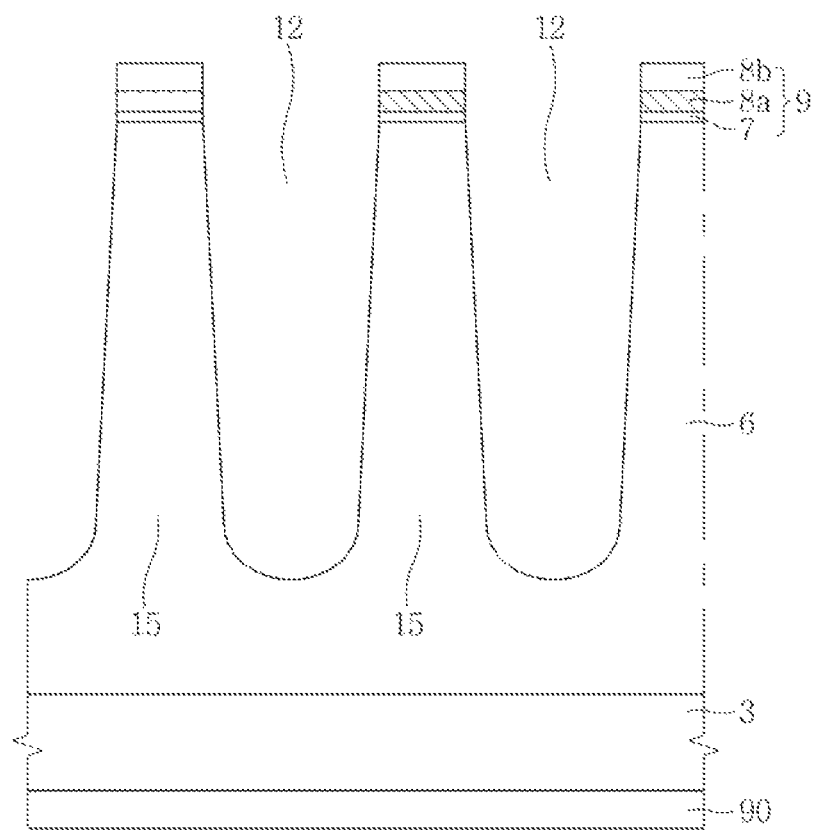

Referring to FIG. 6, an example method of forming a semiconductor device in accordance with principles of inventive concepts may include forming trench regions 12 configured to define an active region 15. The formation of the trench regions 12 may include etching the semiconductor layer 6 using the mask pattern 9 as an etch mask. The trench region 12 may be formed to taper from an upper part to a lower part.

Figure 7:
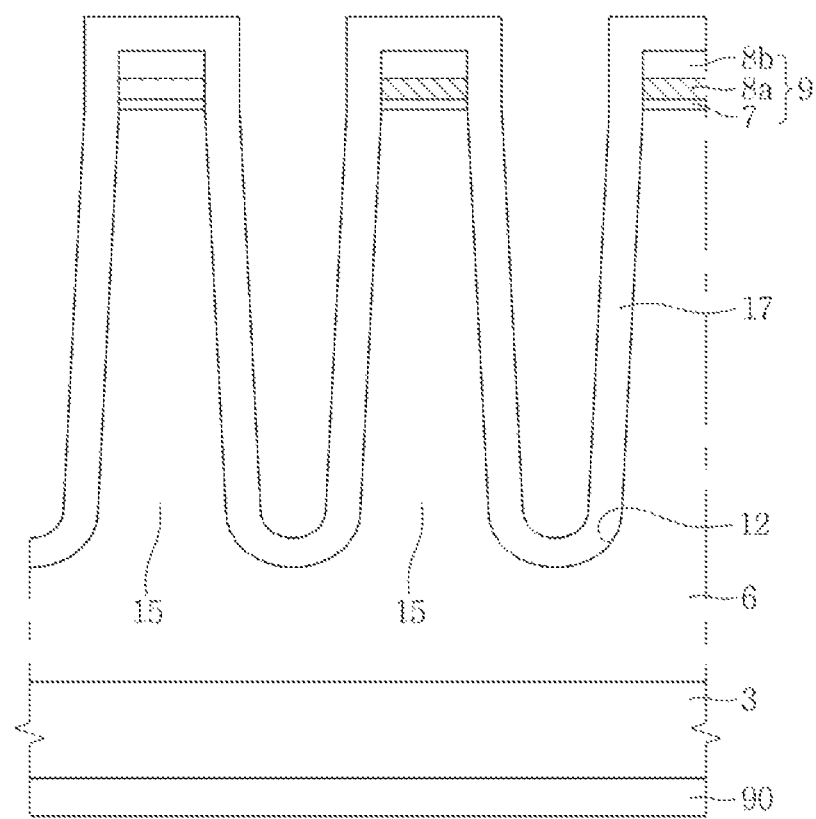

Referring to FIG. 7, an example method of forming a semiconductor device in accordance with principles of inventive concepts may include forming a lower insulating layer 17 over the semiconductor substrate 3 having the trench regions 12. The lower insulating layer 17 may be conformally formed. The lower insulating layer 17 may be formed of silicon oxide.

Figure 8:
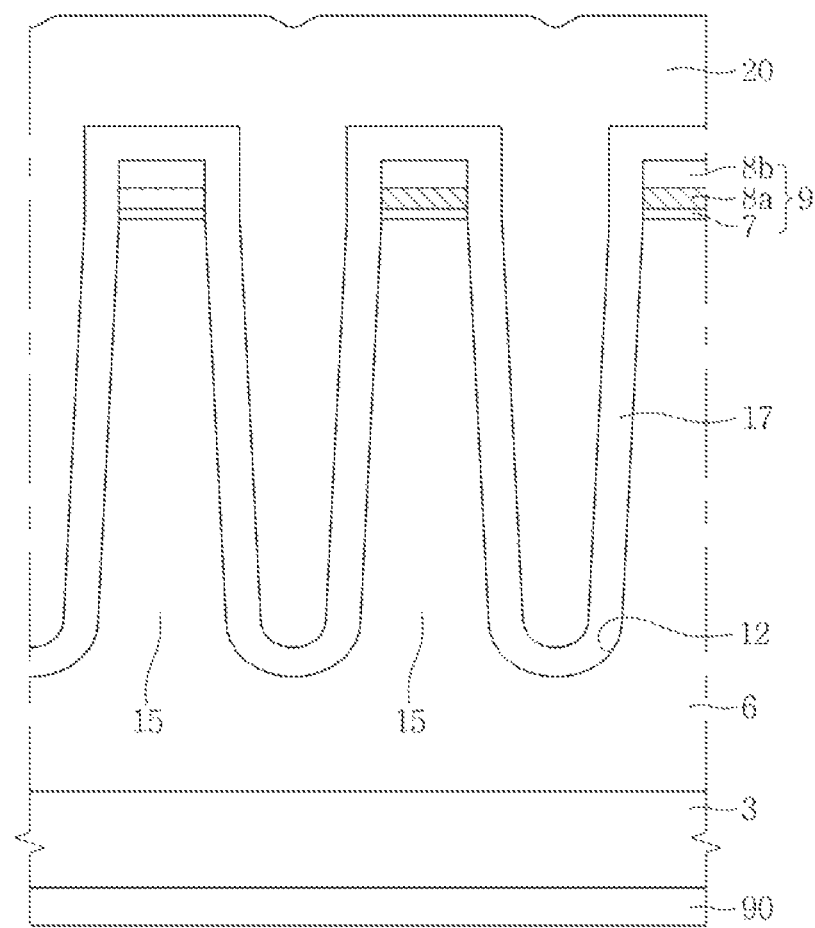

Referring to FIG. 8, an example method of forming a semiconductor device in accordance with principles of inventive concepts may include forming a conductive layer 20 on the lower insulating layer 17. The conductive layer 20 may be formed of a conductive material such as polysilicon, for example.

Figure 9:
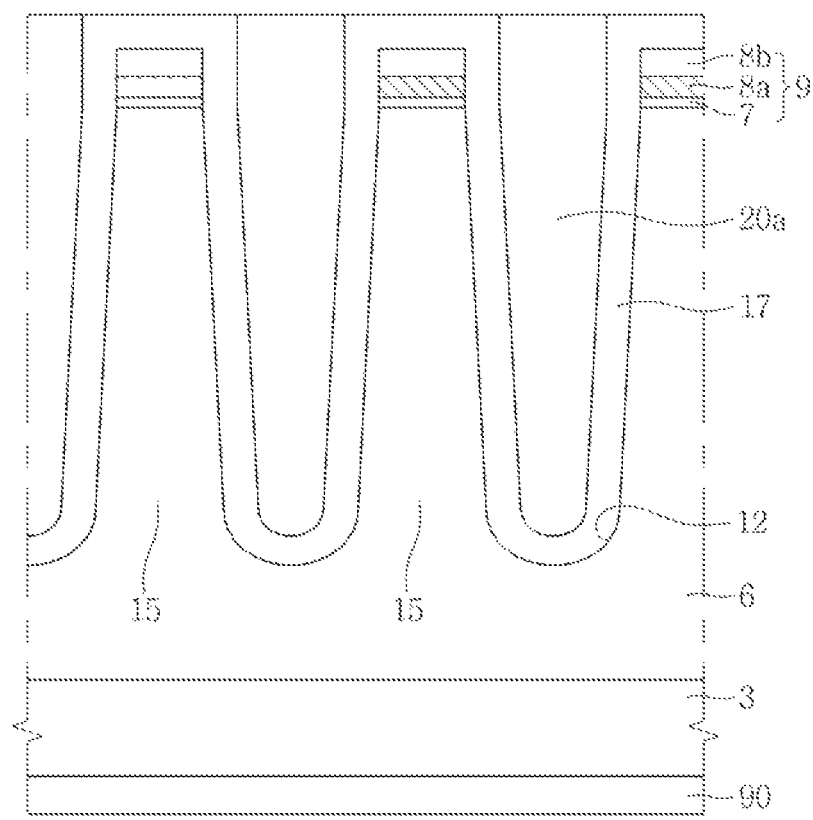

Referring to FIG. 9, an example method of forming a semiconductor device in accordance with principles of inventive concepts may include forming a planarized conductive layer 20a by planarizing the conductive layer 20.

The formation of the planarized conductive layer 20a may include planarizing the conductive layer 20 by performing a planarization process until the lower insulating layer 17 located on the mask pattern 9 is exposed. The planarization process may include a chemical mechanical polishing (CMP) process, for example.

Figure 10:
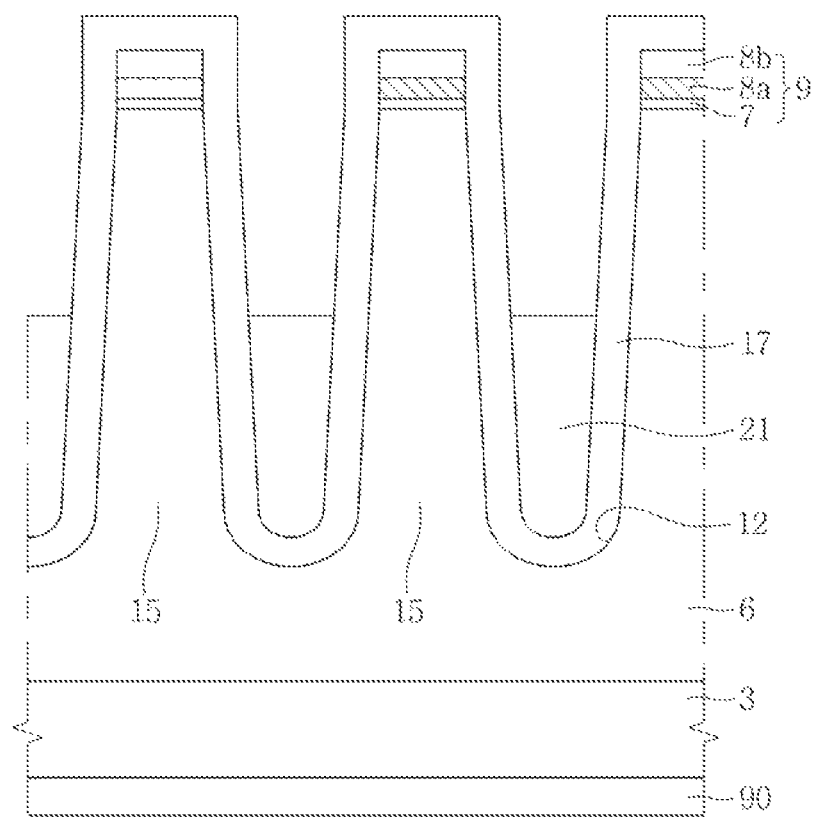

Referring to FIG. 10, an example method of forming a semiconductor device in accordance with principles of inventive concepts may include forming a conductive pattern 21. The formation of the conductive pattern 21 may include partially etching the planarized conductive layer 20a. The conductive pattern 21 may be formed at a lower level than an upper surface of the active region 15.

Figure 11:
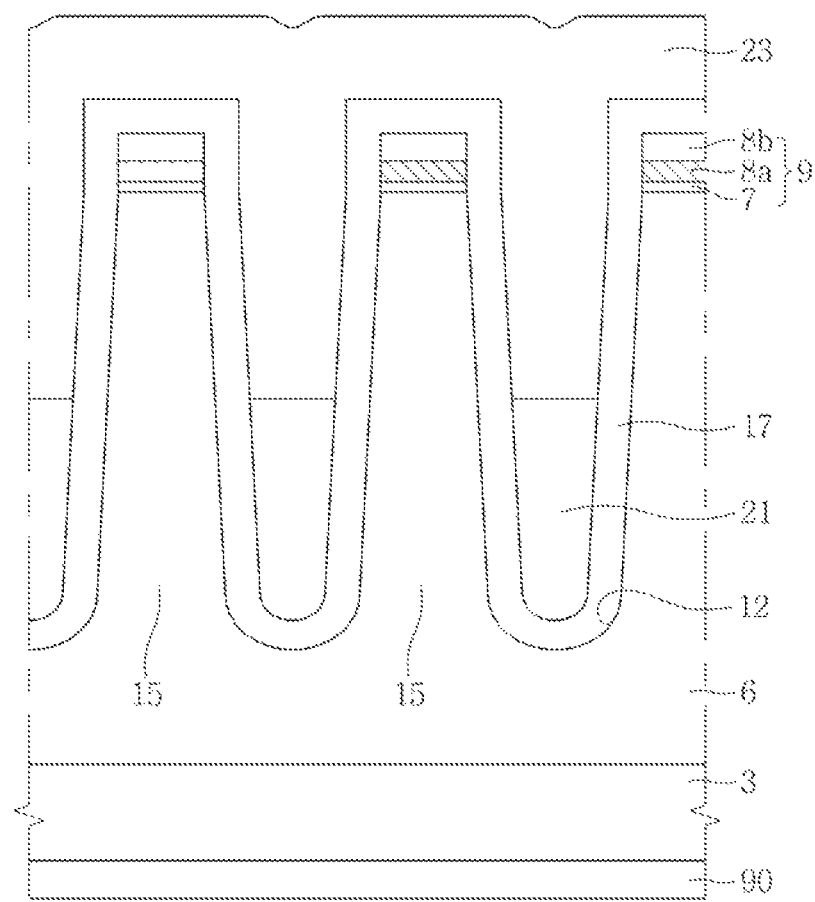

Referring to FIG. 11, an example method of forming a semiconductor device in accordance with principles of inventive concepts may include forming an upper insulating layer 23 over the semiconductor substrate 3 having the conductive pattern 21. The upper insulating layer 23 may be formed of an insulating material such as silicon oxide, for example.

Figure 12:
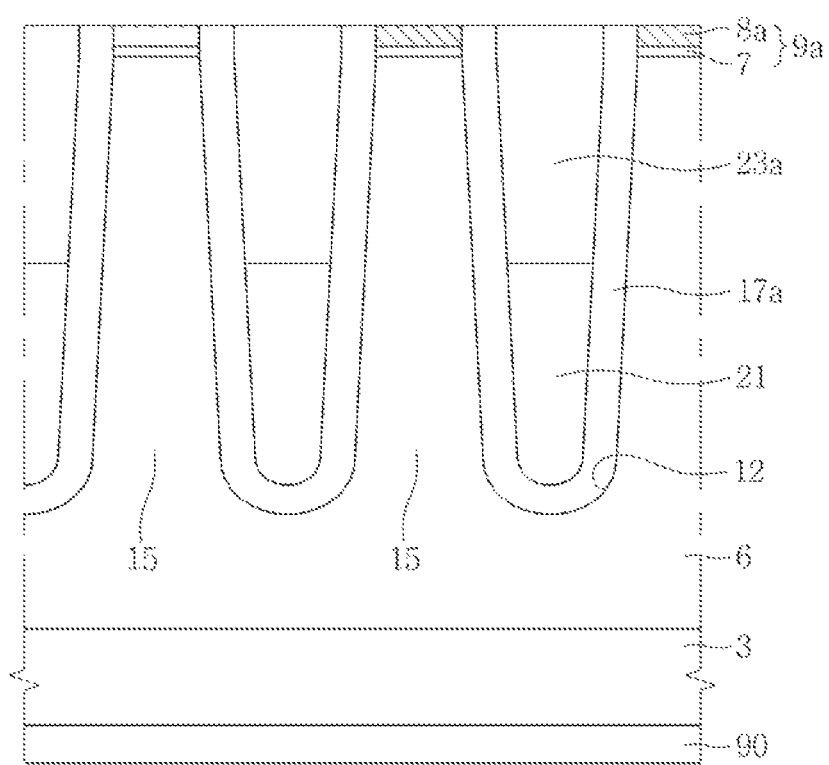

Referring to FIG. 12, an example method of forming a semiconductor device in accordance with principles of inventive concepts may include forming a planarized upper insulating layer 23a and a planarized lower insulating layer 17a by planarizing the upper insulating layer 23 and the lower insulating layer 17. The upper insulating layer 23 may be formed as the planarized upper insulating layer 23a, and the lower insulating layer 17 may be formed as the planarized lower insulating layer 17a, by the planarization process.

In example embodiments in accordance with principles of inventive concepts, the formation of the planarized lower and upper insulating layers 17a and 23a may include planarizing the upper insulating layer 23 and the lower insulating layer 17 by performing a planarization process until the first mask pattern 8a of the mask pattern 9a is exposed. The planarization process may include a CMP process. During the planarization process, the second mask pattern 8b may be removed, and, as a result, a mask pattern 9a whose thickness is reduced may be formed.

In example embodiments, the first mask pattern 8a may be formed of a material having an etch selectivity with respect to the lower and upper insulating layers 17 and 23. The first mask pattern 8a may be formed of silicon nitride, and the lower and upper insulating layers 17 and 23 may be formed of silicon oxide.

Figure 13:
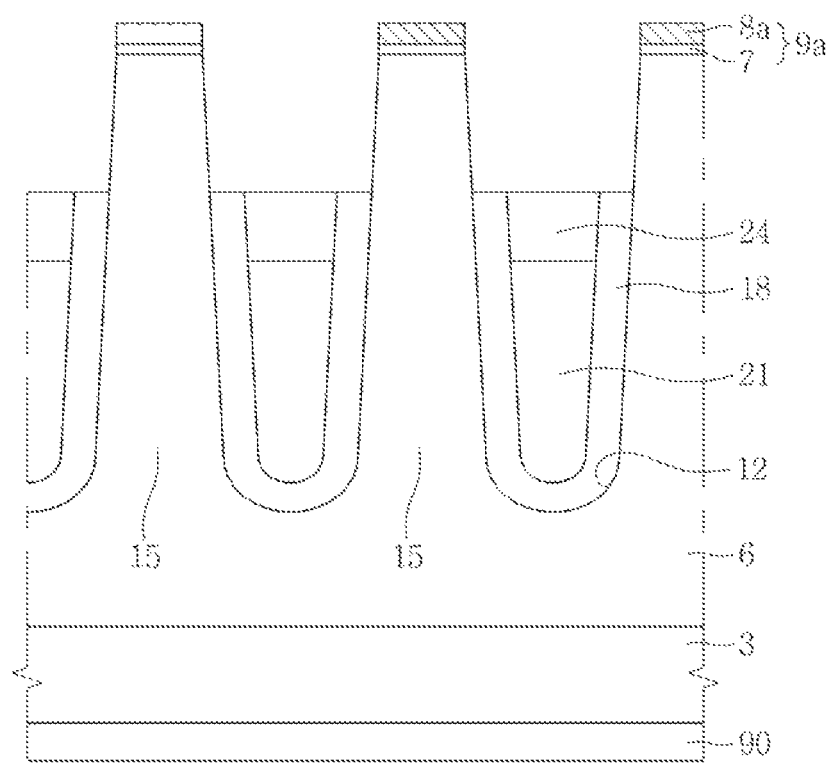

Referring to FIG. 13, an example method of forming a semiconductor device in accordance with principles of inventive concepts may include forming an upper insulating pattern 24 and a lower insulating pattern 18 by partially etching the planarized upper insulating layer 23a and the planarized lower insulating layer 17a. The upper insulating pattern 24 and the lower insulating pattern 18 may be formed of substantially the same material, and etched together.

Since upper surfaces of the planarized lower and upper insulating layers 17a and 23a are substantially planar, upper surfaces of the upper insulating pattern 24 and the lower insulating pattern 18 may be formed to be planar.

The lower insulating pattern 18 may be formed to cover a bottom and sides of the conductive pattern 21, and the upper insulating pattern 24 may be formed to cover an upper surface of the conductive pattern 21 and, as a result, the conductive pattern 21 may be entirely surrounded by the lower and upper insulating patterns 18 and 24.

The lower and upper insulating patterns 18 and 24 may be formed at a lower level than the upper surface of the active region 15 and, as a result, upper sides of the active region 15 may be exposed.

Figure 14A:
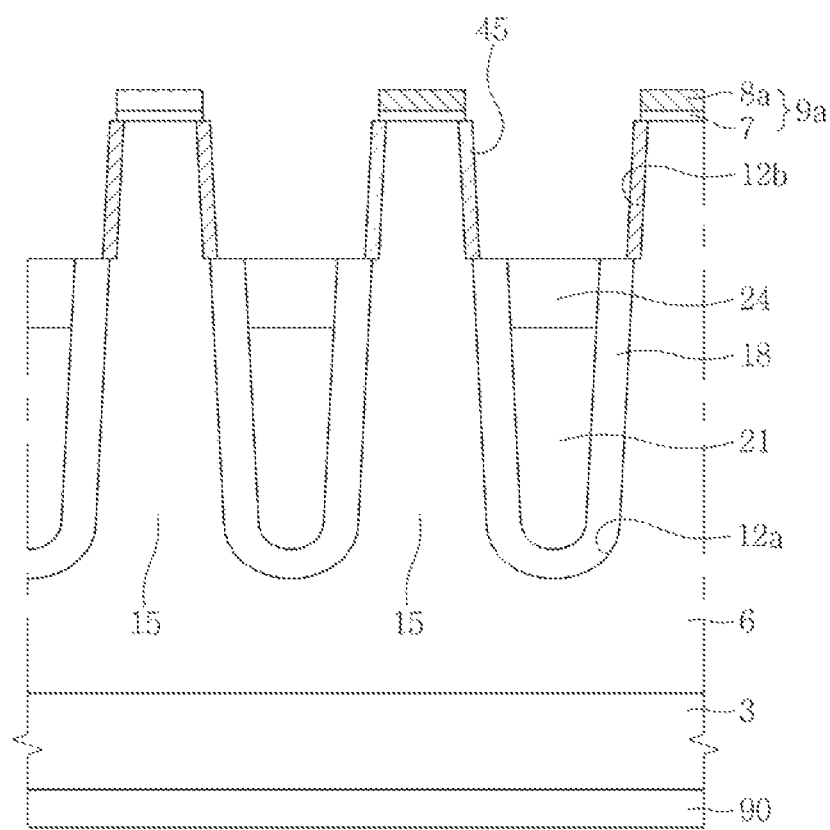

Referring to FIG. 14A, an example method of forming a semiconductor device in accordance with principles of inventive concepts may include forming a sacrificial oxide layer 45 on the exposed side of the active region 15. The formation of the sacrificial oxide layer 45 may include forming a thermal oxide layer on the exposed side of the active region 15 by performing a thermal oxidation process. The sacrificial oxide layer 45 may remedy a defect of the exposed side of the active region 15, for example.

A part of trench region 12, filled with the lower and upper insulating patterns 18 and 24 and the conductive pattern 21, may be defined as a first trench region 12a, and a part located at a higher level than the lower and upper insulating patterns 18 and 24 may be defined as a second trench region 12b.

The method of forming the sacrificial oxide layer 45 is not limited to the method described in FIG. 14A. For example, another example embodiment of forming the sacrificial oxide layer 45 will be described with reference to FIG. 14B.

Figure 14B:
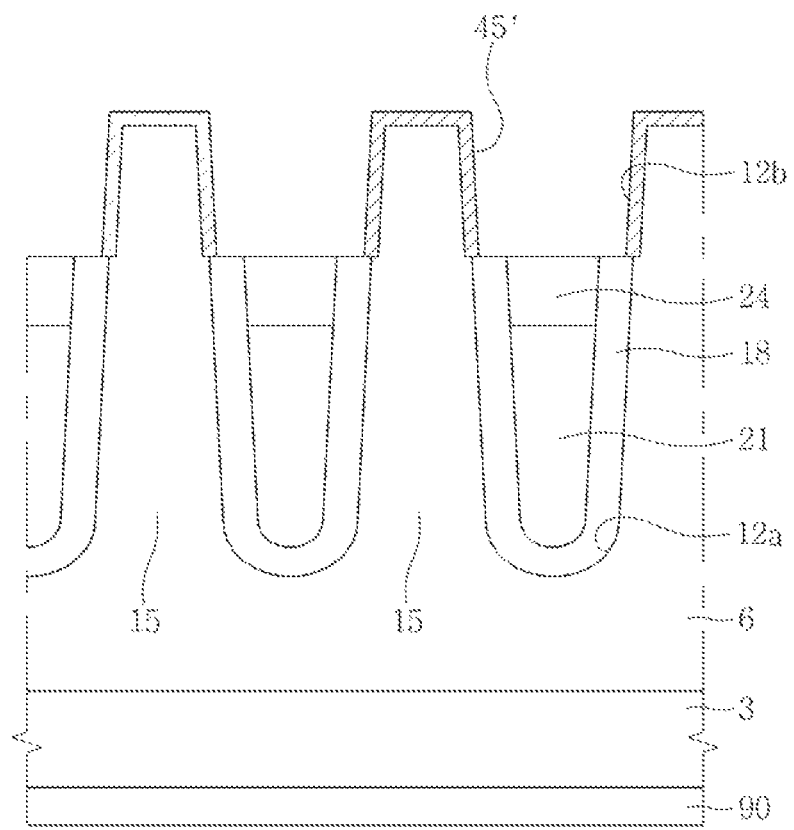

Referring to FIG. 14B, the mask pattern 9a (shown in FIG. 13) is removed, and then a sacrificial oxide layer 45' may be formed by performing a thermal oxidation process. Therefore, the sacrificial oxide layer 45' may be formed on the sides and the upper surface of the active region 15, which are exposed.

Figure 15:
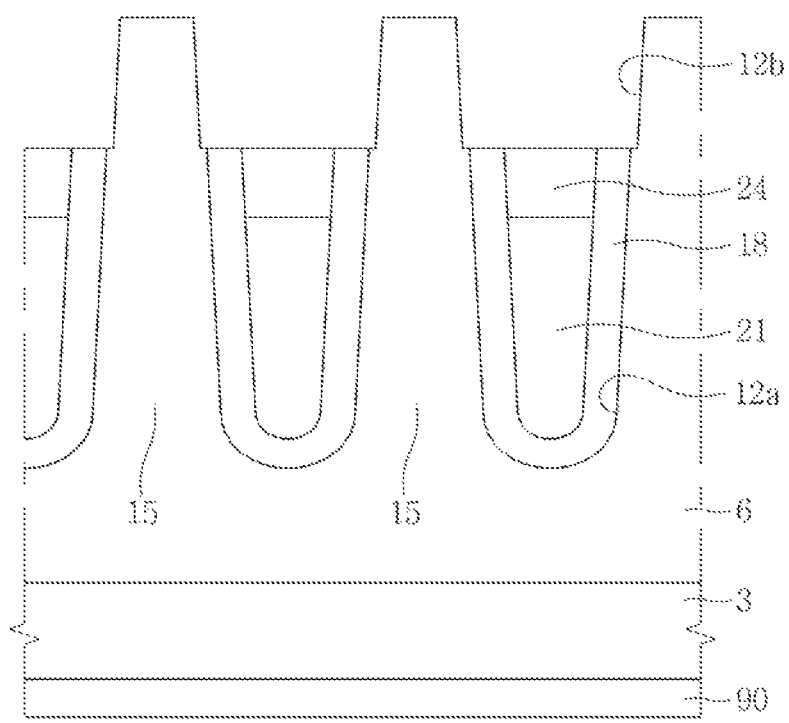

Referring to FIG. 15, an example method of forming a semiconductor device in accordance with principles of inventive concepts may include removing the sacrificial oxide layer 45 (shown in FIG. 14A) or 45' (shown in FIG. 14B) using an etching process. The removal of the sacrificial oxide layer 45 (shown in FIG. 14A) may include removing the first mask pattern 8a of the mask pattern 9a (shown in FIG. 14A), and removing the sacrificial oxide layer 45 (shown in FIG. 14A) and the buffer pattern 7 (shown in FIG. 14A).

Figure 16:
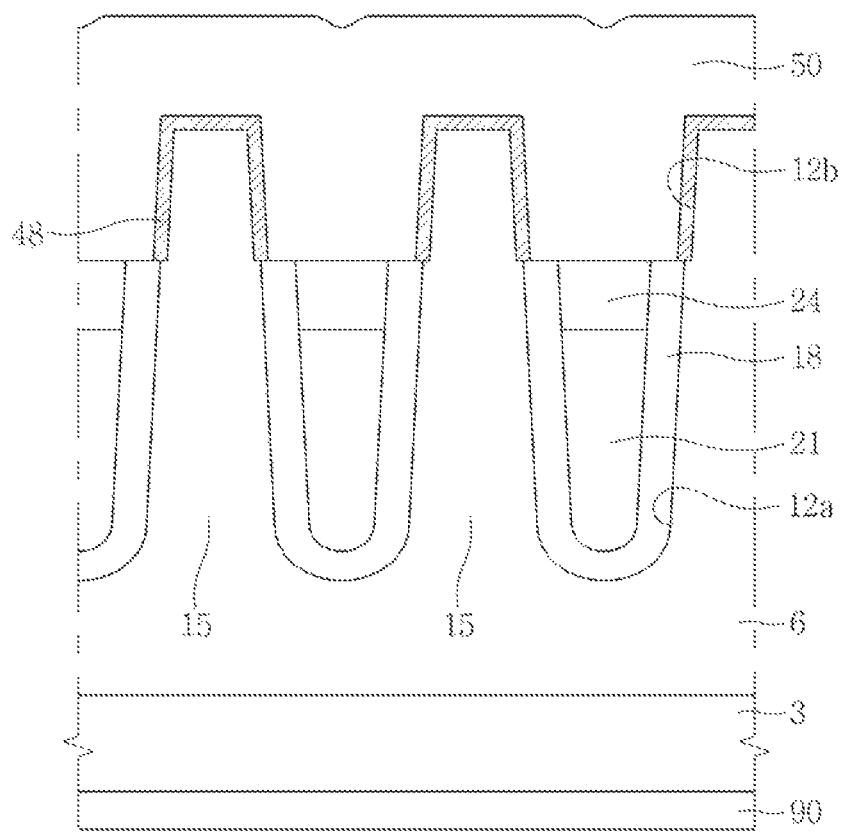

Referring to FIG. 16, an example method of forming a semiconductor device in accordance with principles of inventive concepts may include forming a gate dielectric layer 48 and a gate conductive layer 50. The formation of the gate dielectric layer 48 may include forming a thermal oxide layer on the exposed part of the active region 15 by performing a thermal oxidation process. The formation of the gate conductive layer 50 may include depositing a conductive material, such as polysilicon, for example, over the semiconductor substrate 3 having the gate dielectric layer 48.

Figure 17:
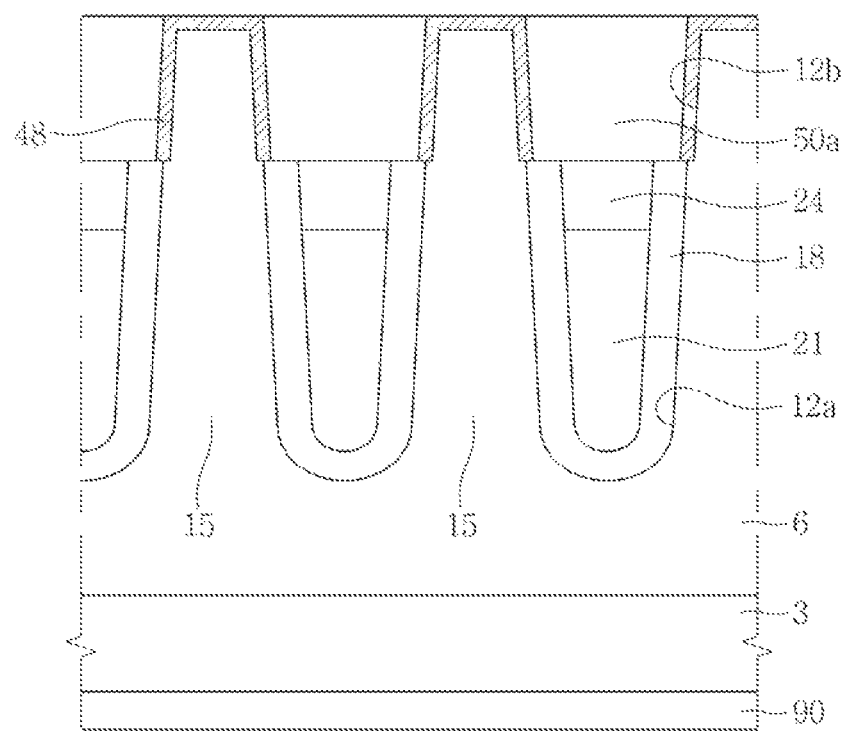

Referring to FIG. 17, an example method of farming a semiconductor device in accordance with principles of inventive concepts may include forming a planarized gate conductive layer 50a by planarizing the gate conductive layer 50.

The formation of the planarized gate conductive layer 50a may include planarizing the gate conductive layer 50 using the gate dielectric layer 48 located on the upper surface of the active region 15 as a planarization stop layer. The gate dielectric layer 48 located on the upper surface of the active region 15 may prevent damage to the upper surface of the active region 15 by the planarization process.

Figure 18:
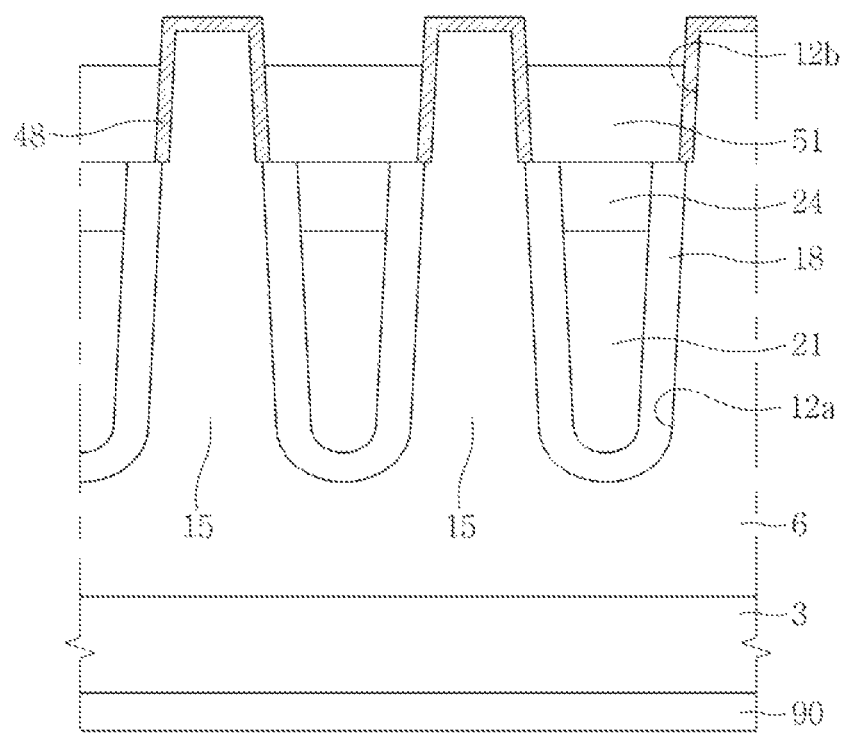

Referring to FIG. 18, an example method of forming a semiconductor device in accordance with principles of inventive concepts may include forming a gate electrode 51.

The formation of the gate electrode 51 may include partially etching the planarized gate conductive layer 50a (shown in FIG. 17). The gate electrode 51 may be formed at a lower level than the upper surface of the active region 15. Since the formation of the gate electrode 51 includes partially etching the planarized gate conductive layer 50a (shown in FIG. 17) using an etching process after planarizing the gate conductive layer 50 (shown in FIG. 16) using a planarization process, an upper surface of the gate electrode 51 may be substantially planar.

Because, in this example embodiment, the conductive pattern 21, the lower insulating pattern 18, and the upper insulating pattern 24 are formed using a planarization process and an etching process together before forming the gate electrode 51, an upper surface of the lower and upper insulating patterns 18 and 24 may be substantially plane, and a bottom of the gate electrode 51 formed on the plane upper surface may be substantially planar.

Because, in accordance with principles of inventive concepts, gate electrode 51 whose upper surface and bottom are substantially planar may be formed, a distribution characteristic of the gate electrode 51 may be improved.

Figure 19:
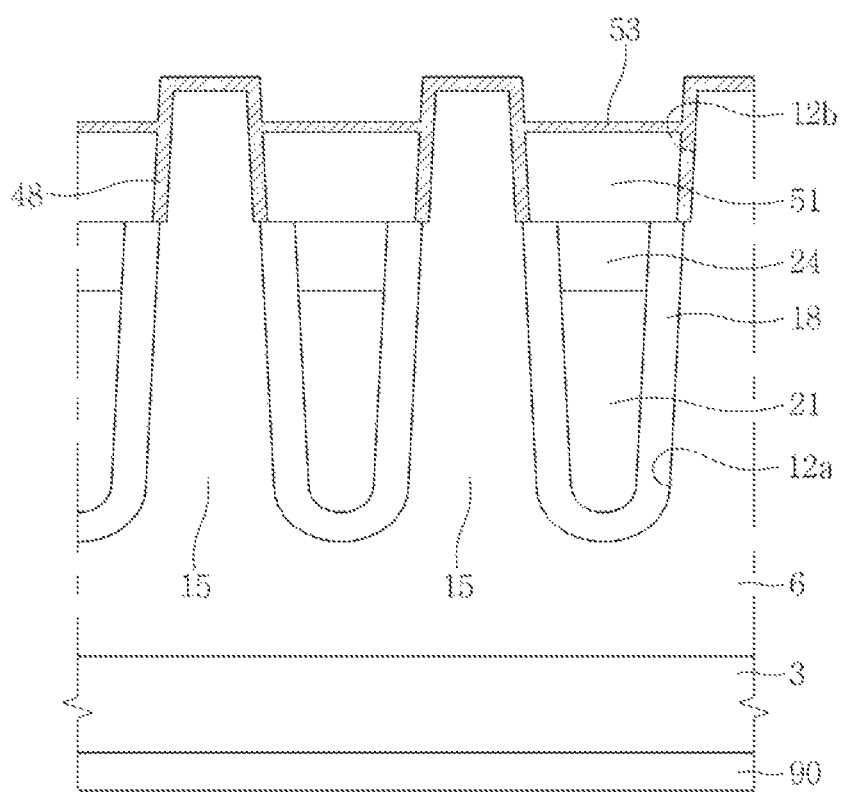

Referring to FIG. 19, an example method of forming a semiconductor device in accordance with principles of inventive concepts may include forming a silicon oxide layer 53 on the gate electrode 51. The formation of the silicon oxide layer 53 may include oxidizing an exposed part of the gate electrode 51 by performing a thermal oxidation process, for example.

In example embodiments gate dielectric layer 48 is formed using a thermal oxidation process, and when the silicon oxide layer 53 is formed using a thermal oxidation process, a boundary between the silicon oxide layer 53 and the gate dielectric layer 48 may be unclear.

Figure 20:
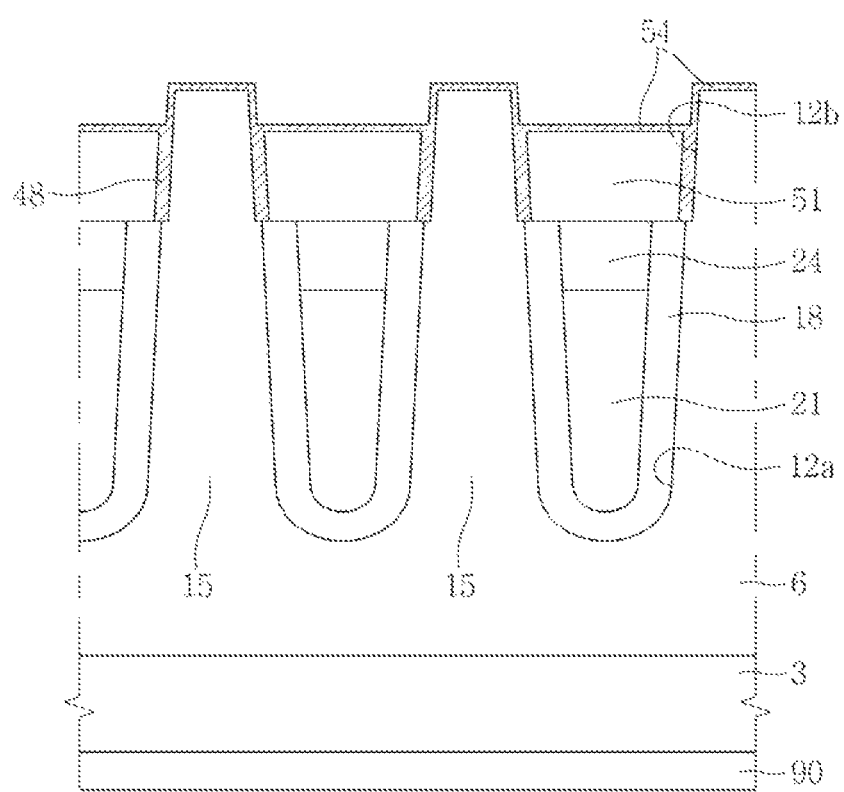

Referring to FIG. 20, an example method of forming a semiconductor device in accordance with principles of inventive concepts may include forming an insulating buffer layer 54. The formation of the insulating buffer layer 54 may include partially etching the silicon oxide layer 53 on the gate electrode 51 and the exposed gate dielectric layer 48 using an isotropic etching process.

Figure 21:
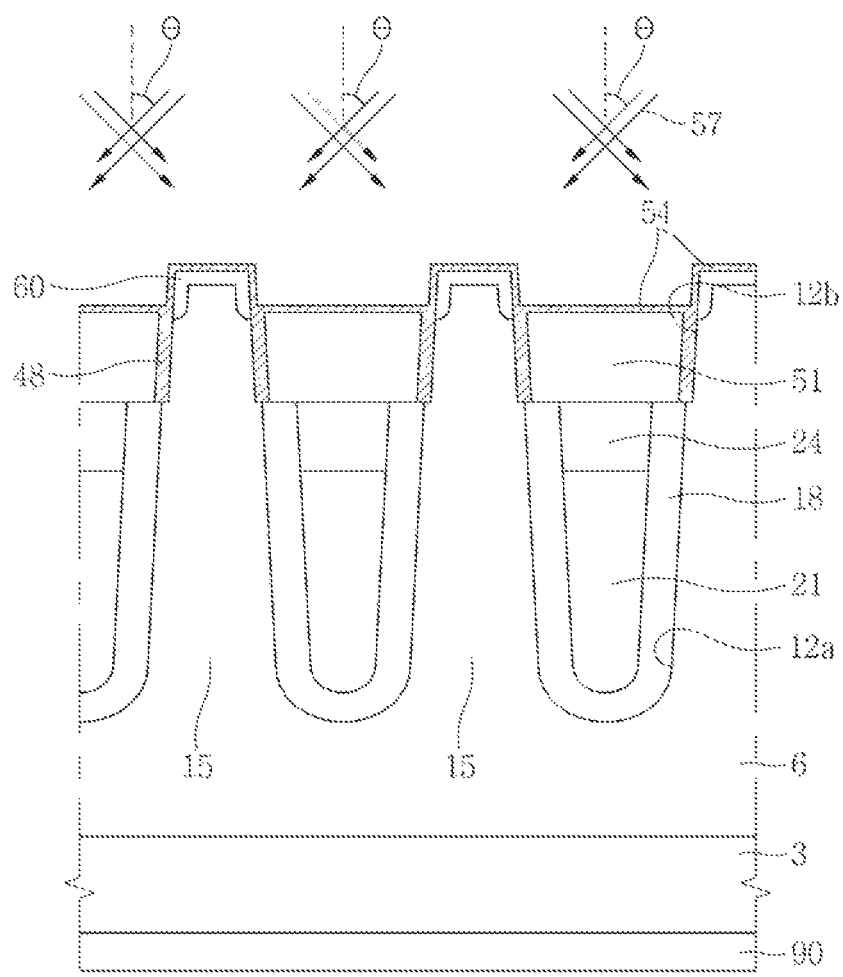

Referring to FIG. 21, an example method of forming a semiconductor device in accordance with principles of inventive concepts may include forming a source impurity region 60 in the active region 15.

The formation of the source impurity region 60 may include implanting impurities into an upper area of the active region 15 by performing a source ion implantation process 57. The source impurity region 60 may be formed to have N-type conductivity by implanting a group 15 element of the long form periodic table, such as phosphorus (P), arsenic (As), or the like, in the upper area of the active region 15.

The source ion implantation process 57 may be performed by a slant ion implantation process. The source ion implantation process 57 may include implanting a group 15 element of the long form periodic table, such as phosphorus (P), arsenic (As), or the like, at a slant angle "θ" with respect to the semiconductor substrate 3 or the upper area of the active region 15. The source impurity region 60 may be formed to have a substantially uniform depth from the surface of the active region 15 located at a higher level than the gate electrode 51.

Figure 22:
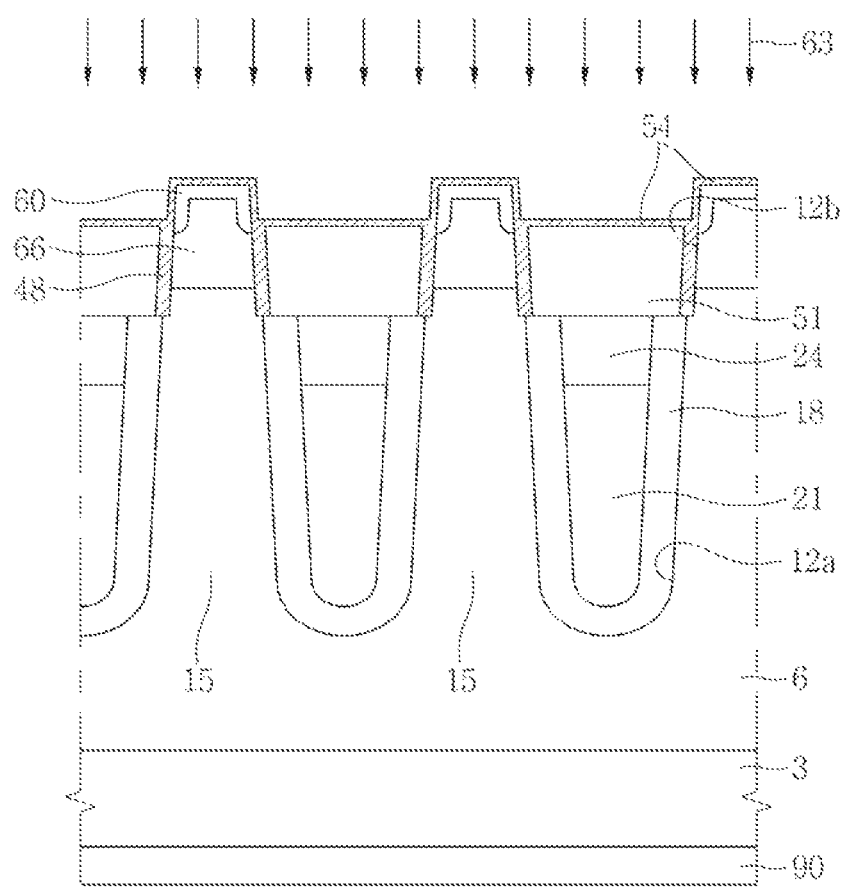

Referring to FIG. 22, an example method of forming a semiconductor device in accordance with principles of inventive concepts may include forming a channel impurity region 66 in the active region 15.

The formation of the channel impurity region 66 may include implanting a group 13 element of the long form periodic table, such as boron (B), or the like, in the active region 15 by performing a channel ion implantation process 63, for example. The channel impurity region 66 may be formed in the active region 15 under the source impurity region 60. A bottom of the channel impurity region 66 may be formed to be at a higher level of the bottom of the gate electrode 51.

The insulating buffer layer 54 may serve to prevent damage to the surface of the active region 15 from the source ion implantation process 57 and the channel ion implantation process 63.

Figure 23:
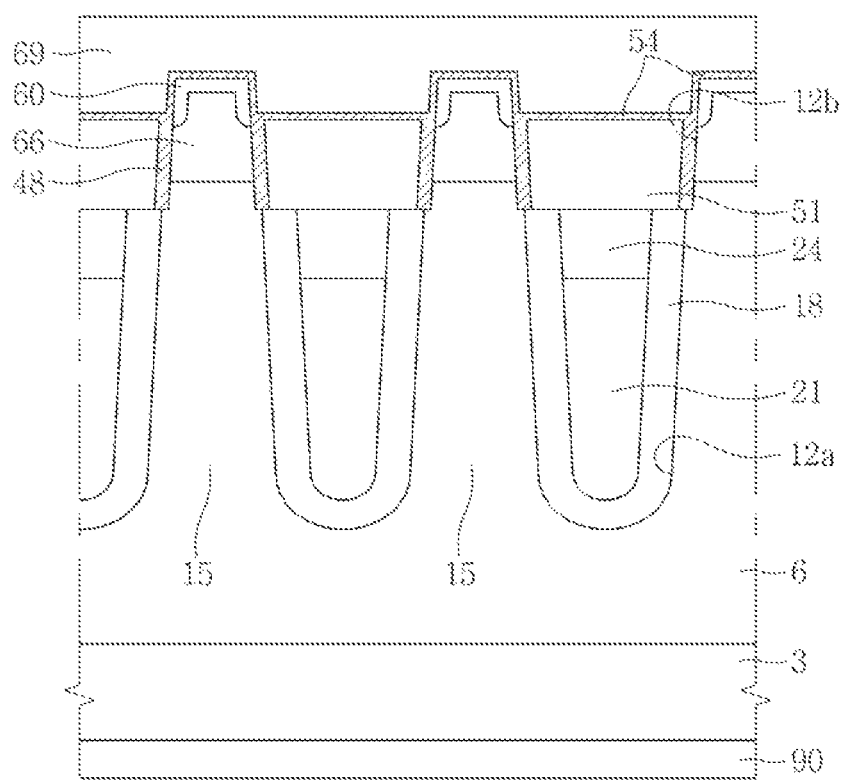

Referring to FIG. 23, an example method of forming a semiconductor device in accordance with principles of inventive concepts may include forming an insulating capping layer 69.

The formation of the insulating capping layer 69 may include forming a silicon oxide layer over the semiconductor substrate 3 having the channel impurity region 66 and the source impurity region 60.

Figure 24:
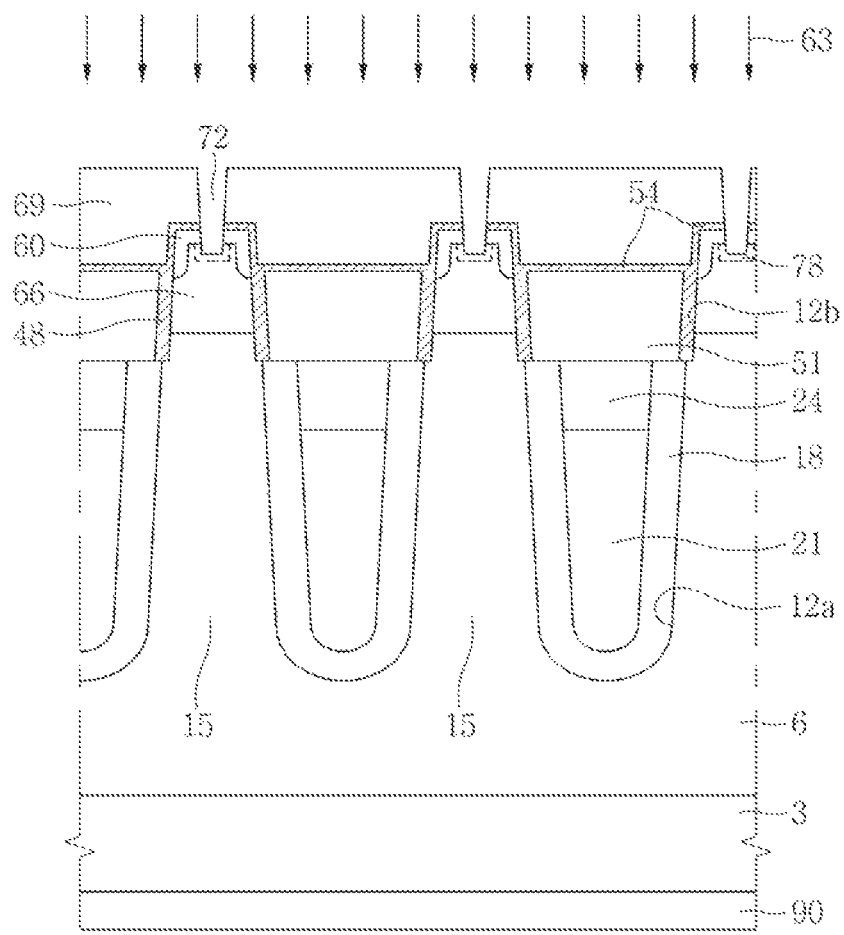

Referring to FIG. 24, an example method of foaming a semiconductor device in accordance with principles of inventive concepts may include forming a groove region 72 in the upper area of the active region 15.

The formation of the groove region 72 may include forming an opening part by patterning the insulating capping layer 69, and sequentially etching the insulating buffer layer 54 and the active region 15, which are located under the opening part. The groove region 72 may be formed to pass through the insulating capping layer 69 and the source impurity region 60, and extend into the channel impurity region 66. The groove region 72 may expose a part of the channel impurity region 66.

An example method of forming a semiconductor device in accordance with principles of inventive concepts may include forming a body contact impurity region 78 by performing a body contact ion implanting process 75. The body contact impurity region 78 may be formed in a surface of the channel impurity region 66 exposed by the groove region 72.

In an example embodiment, the body contact impurity region 78 may have the same conductivity type as the channel impurity region 66, and an impurity concentration of one order or more than the channel impurity region 66.

In an example embodiment, the body contact impurity region 78 may have a different conductivity type from the source impurity region 60, and an impurity concentration of one order or less than the source impurity region 60. As a result, the conductivity type of the source impurity region 60 may not be changed by the additional ion implanting process 75.

Figure 25:
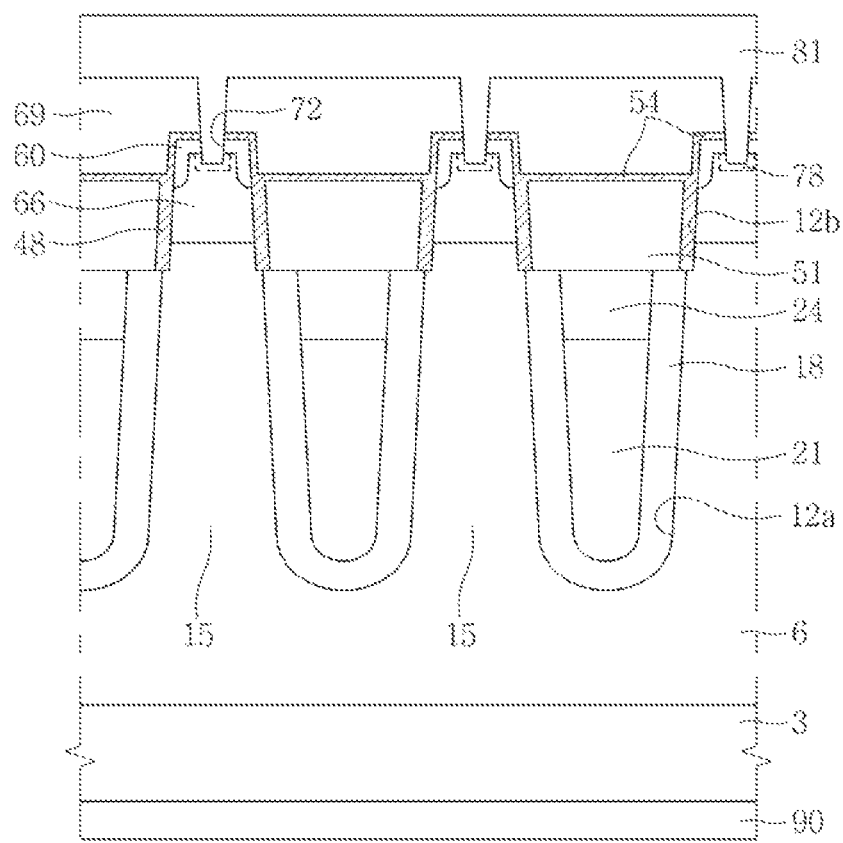

Referring to FIG. 25, an example method of forming a semiconductor device in accordance with principles of inventive concepts may include forming a front-side conductive layer 81.

The formation of the front-side conductive layer 81 may include forming a conductive layer over the semiconductor substrate 3 having the body contact impurity region 78. The front-side conductive layer 81 may form an ohmic contact with the body contact impurity region 78 and the source impurity region 60.

Referring again to FIG. 1, an example method of forming a semiconductor device in accordance with principles of inventive concepts may include reducing the thickness of the semiconductor substrate 3 by grinding a back side of the semiconductor substrate 3, and forming a back-side conductive layer 90 on the back side of the semiconductor substrate 3. An example embodiment of semiconductor device 1 described in FIG. 1 in accordance with principles of inventive concepts may thereby be formed.

Next, a method of forming an example embodiment of a semiconductor device in accordance with principles of inventive concepts will be described with reference to FIGS. 26 to 34.

Figure 26:
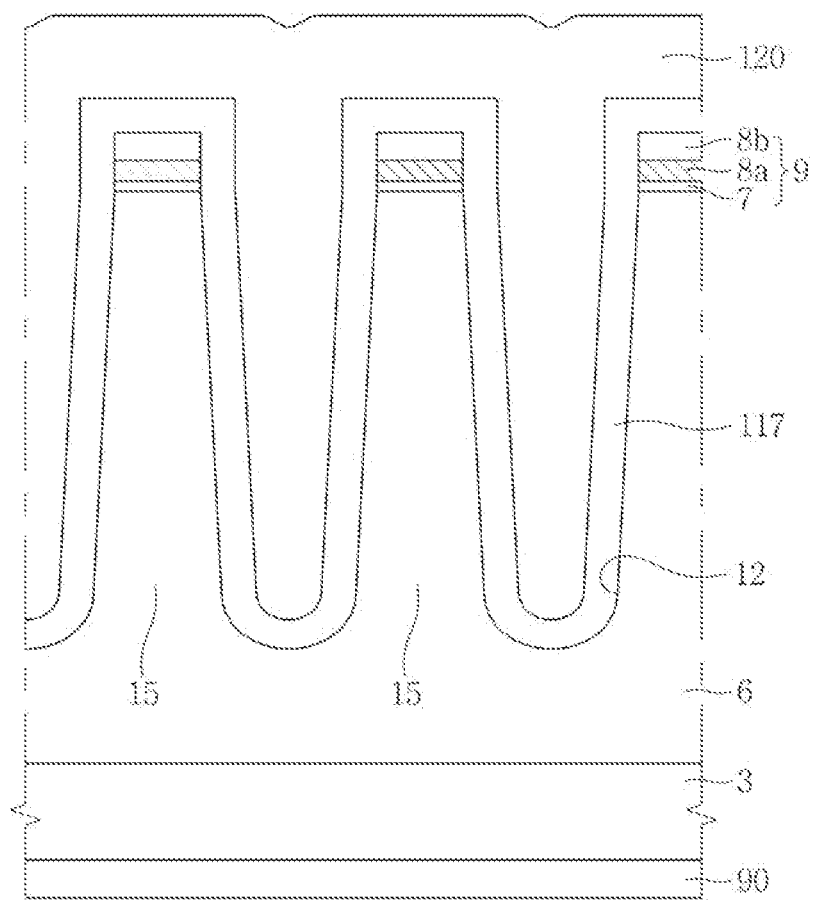
FIGS. 26 to 34 are cross-sectional views showing a method of forming an example embodiment of a semiconductor device in accordance with principles of inventive concepts.

Referring to FIG. 26, an example method of forming the example embodiment of a semiconductor device in accordance with principles of inventive concepts may include forming a mask pattern 9 on a semiconductor layer 6 of a semiconductor substrate 3, and forming trench regions 12 configured to define an active region 15, as described in FIGS. 5 and 6.

The method of forming the example embodiment of a semiconductor device in accordance with principles of inventive concepts may include conformally forming a lower insulating layer 117 over the semiconductor substrate 3 including the trench regions 12, and forming a lower conductive layer 120 on the lower insulating layer 117. The lower insulating layer 117 may be formed of silicon oxide, and the lower conductive layer 120 may be formed of a conductive material such as polysilicon, for example.

Figure 27:
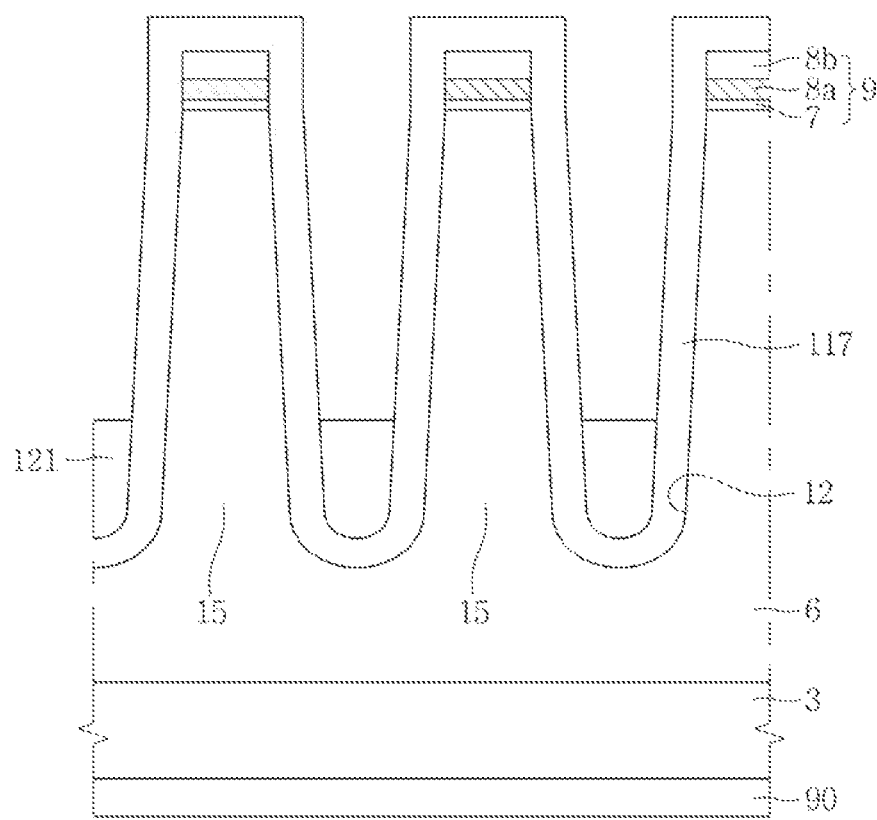

Referring to FIG. 27, an example method of forming the example embodiment of a semiconductor device in accordance with principles of inventive concepts may include forming a lower conductive pattern 121.

The formation of the lower conductive pattern 121 may include planarizing the lower conductive layer 120 (shown in FIG. 26) using the method described in FIG. 9 by performing a planarization process until the lower insulating layer 117 is exposed, and etching the planarized lower conductive layer using the method described in FIG. 10.

Figure 28:
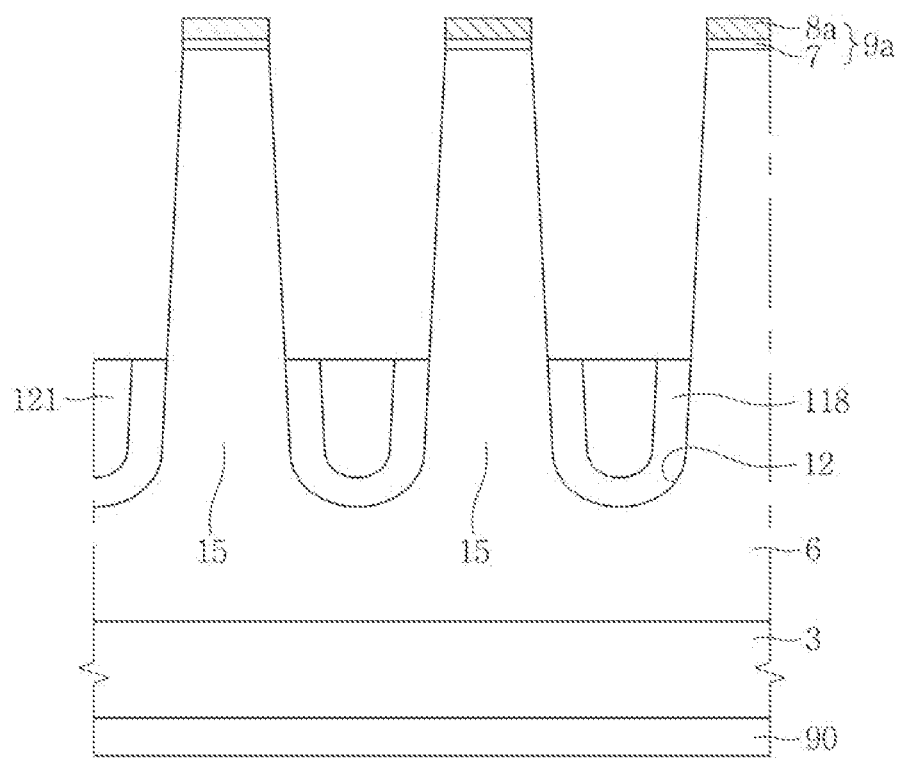

Referring to FIG. 28, an example method of forming the example embodiment of a semiconductor device in accordance with principles of inventive concepts may include forming a lower insulating pattern 118.

The formation of the lower insulating pattern 118 may include etching the lower insulating layer 117 (shown in FIG. 27). The lower insulating pattern 118 may be formed to surround the bottom and sides of the lower conductive pattern 121.

While etching the lower insulating layer 117 (shown in FIG. 27), the second mask pattern 8b of the mask pattern 9 (shown in FIG. 27) may be etched and removed. In example embodiments in accordance with principles of inventive concepts, a mask pattern 9a whose thickness is reduced may thereby be formed.

Figure 29:
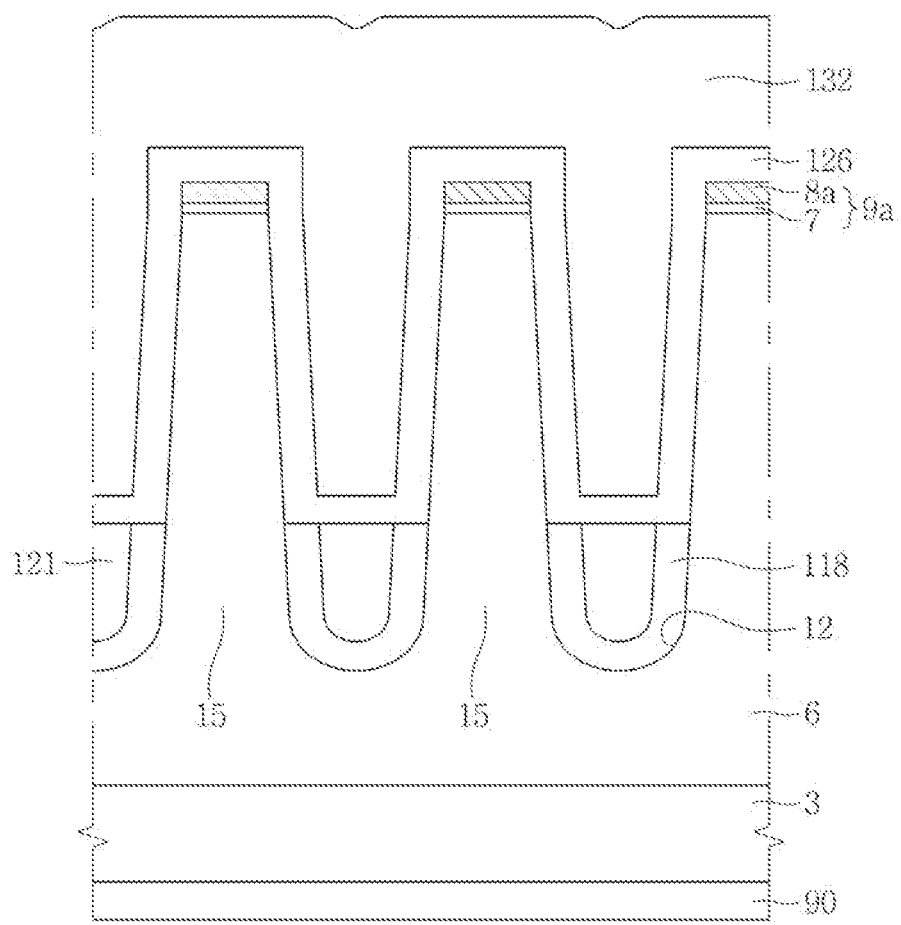

Referring to FIG. 29, an example method of forming the example embodiment of a semiconductor device in accordance with principles of inventive concepts may include conformally forming an intermediate insulating layer 126 over the semiconductor substrate 3 having the lower insulating pattern 118, and forming an upper conductive layer 132 on the intermediate insulating layer 126. The intermediate insulating layer 126 may be formed of an insulating material such as silicon oxide, or the like, and the upper conductive layer 132 may be formed of a conductive material such as polysilicon, for example.

Figure 30:
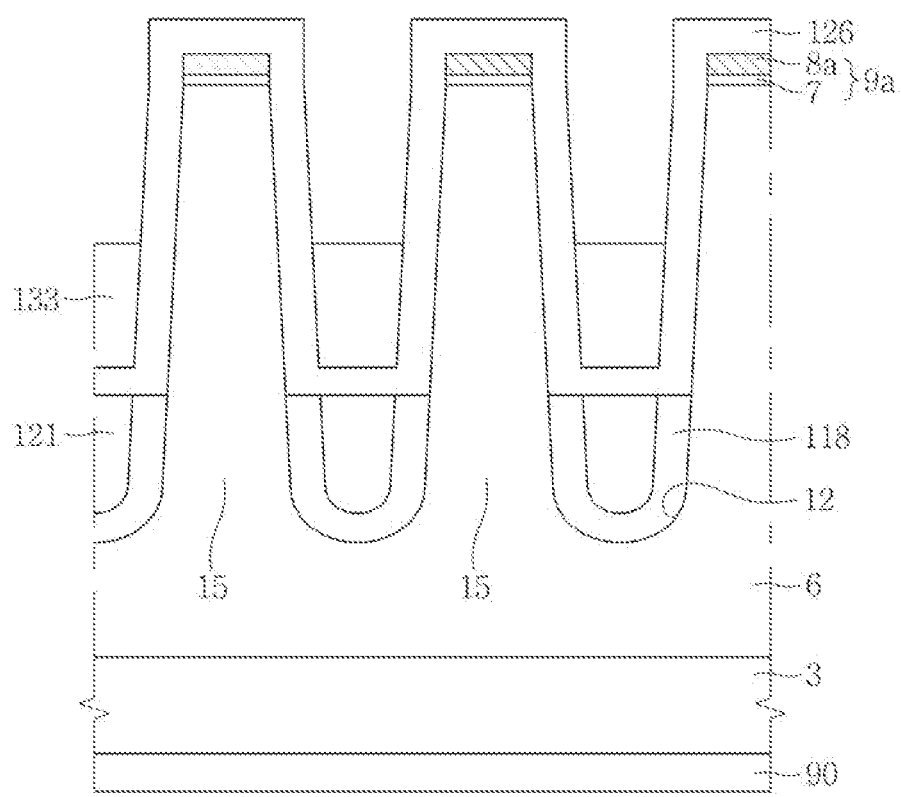

Referring to FIG. 30, an example method of forming the example embodiment of a semiconductor device in accordance with principles of inventive concepts may include forming an upper conductive pattern 133.

The formation of the upper conductive pattern 133 may include planarizing the upper conductive layer 132 (shown in FIG. 29) using the method described in FIG. 9 by performing a planarization process until the intermediate insulating layer 126 is exposed, and etching the planarized upper conductive layer using the method described in FIG. 10.

Figure 31:
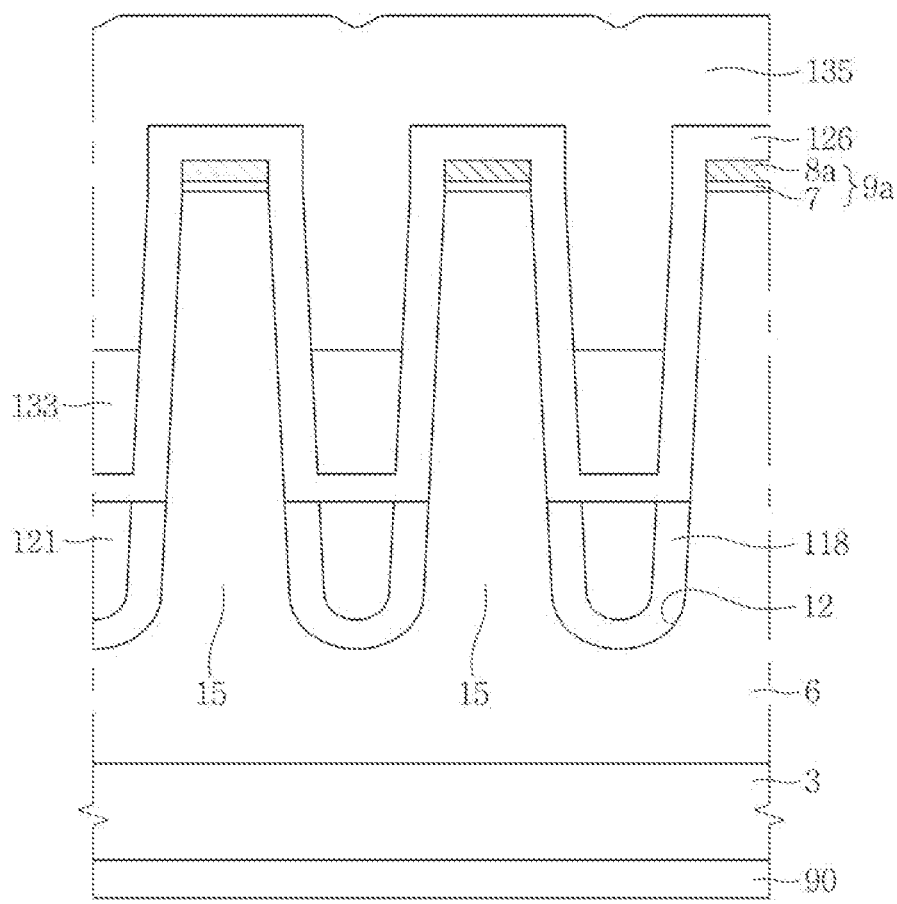

Referring to FIG. 31, an example method of forming the example embodiment of a semiconductor device in accordance with principles of inventive concepts may include forming an upper insulating layer 135 over the semiconductor substrate 3 having the upper conductive pattern 133. The upper insulating layer 135 may be formed of silicon oxide.

Figure 32:
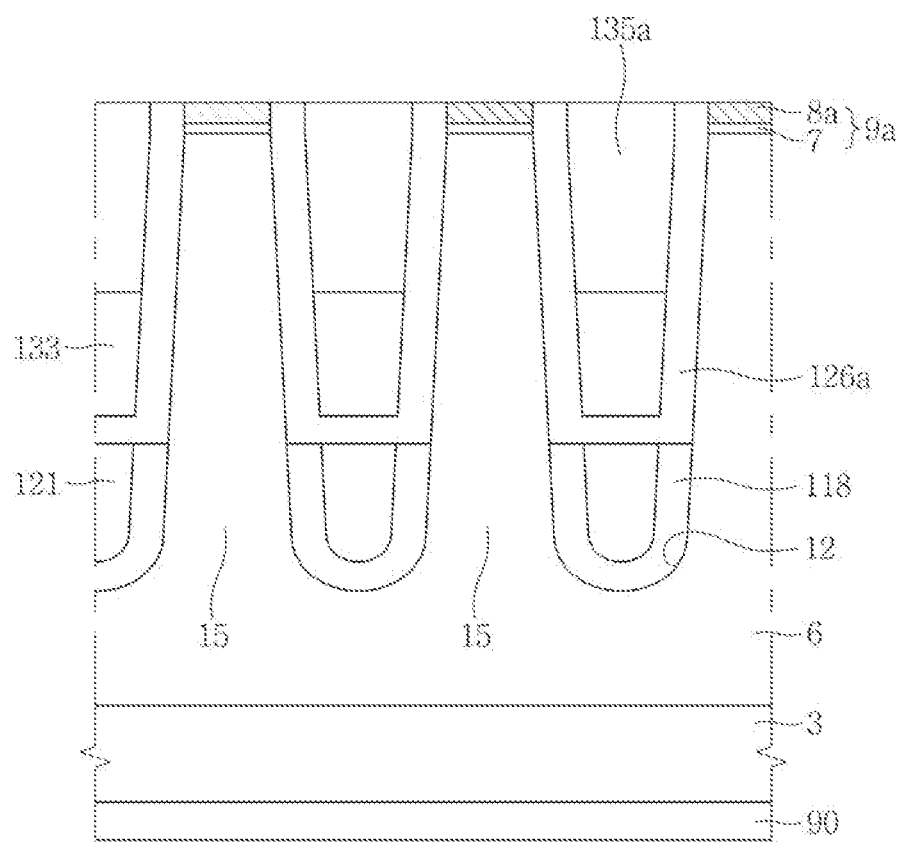

Referring to FIG. 32, an example method of forming the example embodiment of a semiconductor device in accordance with principles of inventive concepts may include forming a planarized upper insulating layer 135a and a planarized intermediate insulating layer 126a by planarizing the upper insulating layer 135 (shown in FIG. 31) and the intermediate insulating layer 126 (shown in FIG. 31).

The formation of the planarized upper and intermediate insulating layers 135a and 126a may include planarizing upper insulating layer 135 (shown in FIG. 31) and the intermediate insulating layer 126 (shown in FIG. 31) by performing a planarization process until the first mask pattern 8a of the mask pattern 9a is exposed. The planarization process may include a CMP process.

Figure 33:
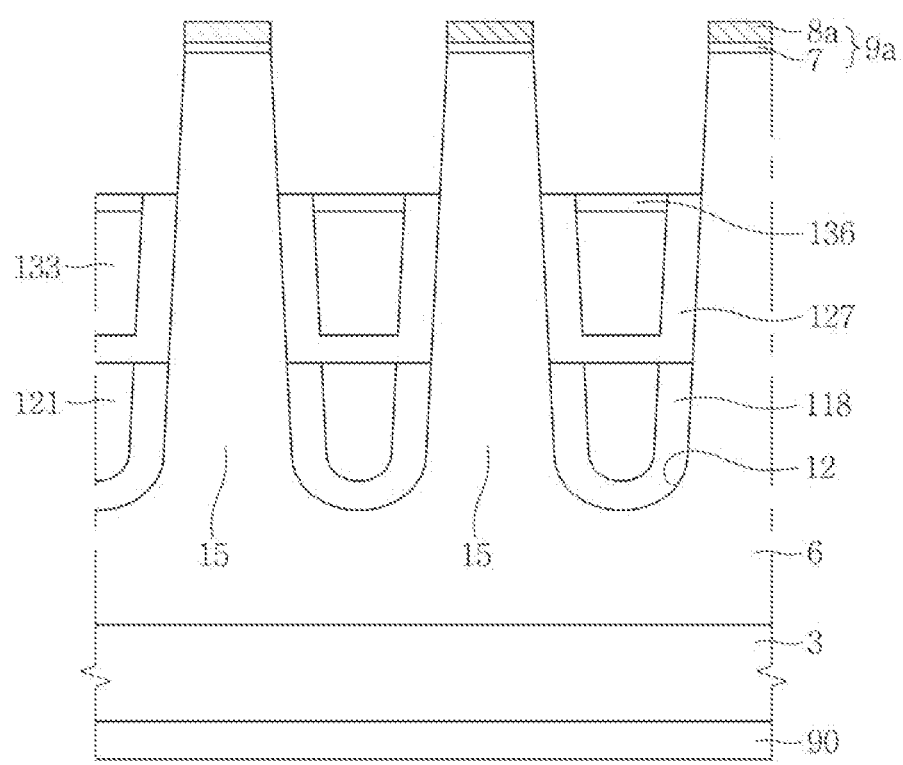

Referring to FIG. 33, an example method of forming the example embodiment of a semiconductor device in accordance with principles of inventive concepts may include forming an upper insulating pattern 136 and an intermediate insulating pattern 127 by partially etching the planarized upper insulating layer 135a and the planarized intermediate insulating layer 126a. Because, in accordance with principles of inventive concepts, upper surfaces of the upper and intermediate insulating layers 135a and 126a (shown in FIG. 32) are substantially plane, upper surfaces of the upper insulating pattern 136 and the intermediate insulating pattern 127 may be formed to be planar.

Figure 34:
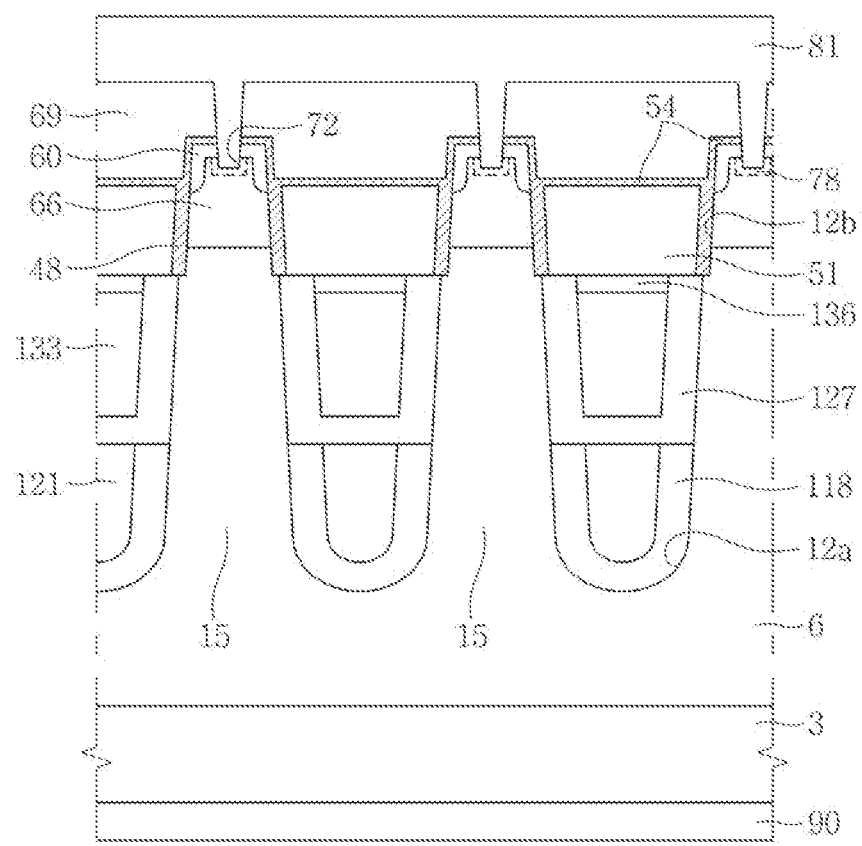

Referring to FIG. 34, an example method of forming the example embodiment of a semiconductor device in accordance with principles of inventive concepts may include forming a gate dielectric layer 48, a gate electrode 51, an insulating buffer layer 54, a source impurity region 60, a channel impurity region 66, an insulating capping layer 69, a groove region 72, a body contact impurity region 78, and a front-side conductive layer 81 by performing the processes described in FIGS. 14A, 14B, and 15 to 25.

Referring again to FIG. 3, an example method of forming the example embodiment of a semiconductor device in accordance with principles of inventive concepts may include reducing the thickness of the semiconductor substrate 3 by grinding a back side of the semiconductor substrate 3, and forming a back-side conductive layer 90 on the back side of the semiconductor substrate 3. In example embodiments, the semiconductor device 100 described in FIG. 3 in accordance with an embodiment of inventive concepts may therefore be formed.

Next, a method of forming an example embodiment of a semiconductor device in accordance with principles of inventive concepts will be described with reference to FIGS. 35 to 43.

Figure 35:
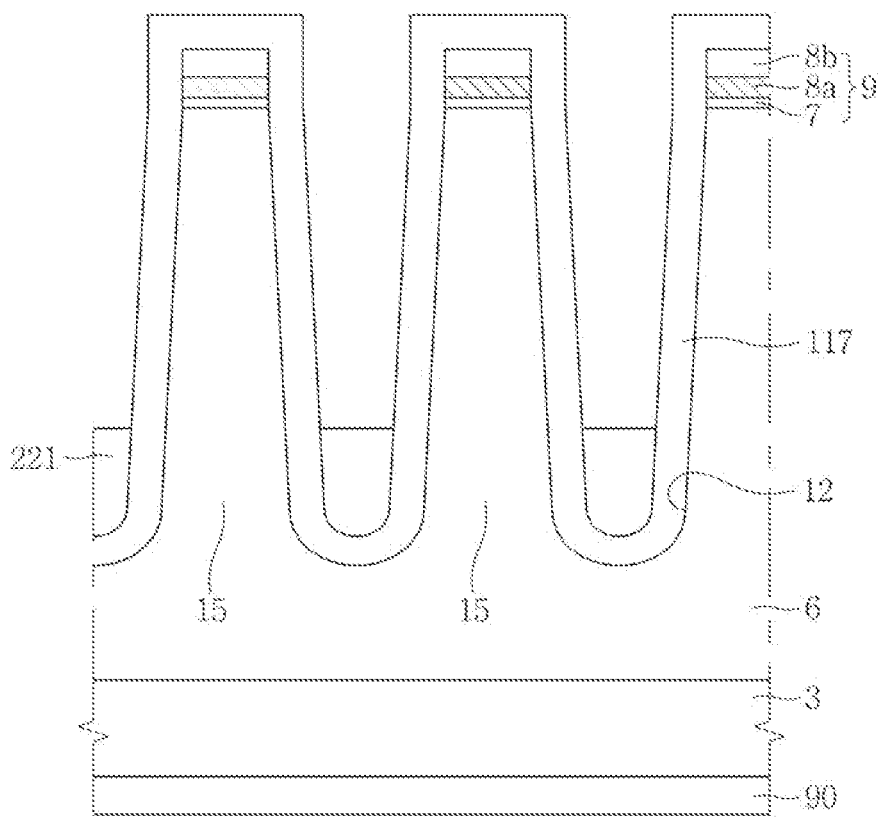
FIGS. 35 to 43 are cross-sectional views showing a method of forming an example embodiment of a semiconductor device in accordance with principles of inventive concepts.

Referring to FIG. 35, an example method of forming the example embodiment of a semiconductor device in accordance with principles of inventive concepts may include forming a mask pattern 9 on a semiconductor layer 6 of a semiconductor substrate 3, and forming trench regions 12 configured to define an active region 15 such as described in FIGS. 5 and 6.

The method of forming the example embodiment of a semiconductor device in accordance with principles of inventive concepts may include conformally forming a lower insulating layer 117 over the semiconductor substrate 3 having the trench regions 12 by performing the same process described in FIG. 7.

The method of forming the example embodiment of a semiconductor device in accordance with principles of inventive concepts may include forming a lower conductive pattern 221.

The formation of the lower conductive pattern 221 may include forming a lower conductive layer on the lower insulating layer 117 such as described in FIG. 8, forming a planarized lower insulating layer by planarizing the lower conductive layer using the method described in FIG. 9, and etching the planarized lower insulating layer using the method described in FIG. 10. The lower conductive pattern 221 may be formed of a conductive material such as polysilicon, etc.

Figure 36:
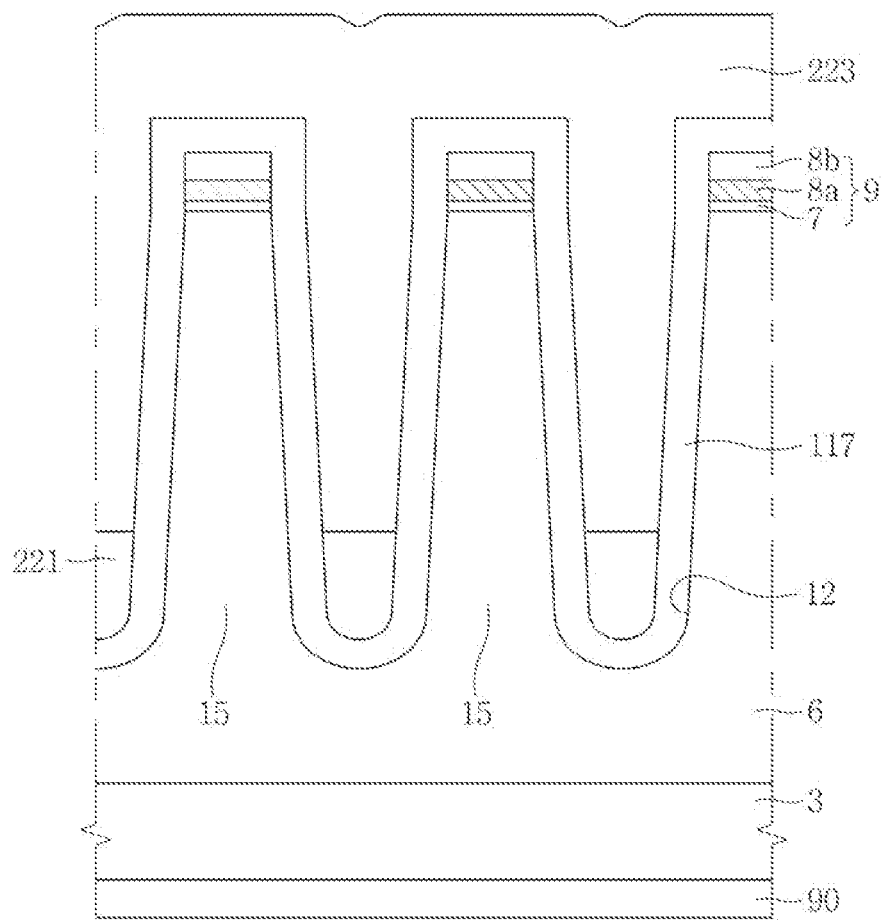

Referring to FIG. 36, an example method of forming the example embodiment of a semiconductor device in accordance with principles of inventive concepts may include forming an auxiliary insulating layer 223 over the semiconductor substrate 3 having the lower conductive pattern 221. The lower insulating layer 117 and the auxiliary insulating layer 223 may be formed of silicon oxide, for example.

Figure 37:
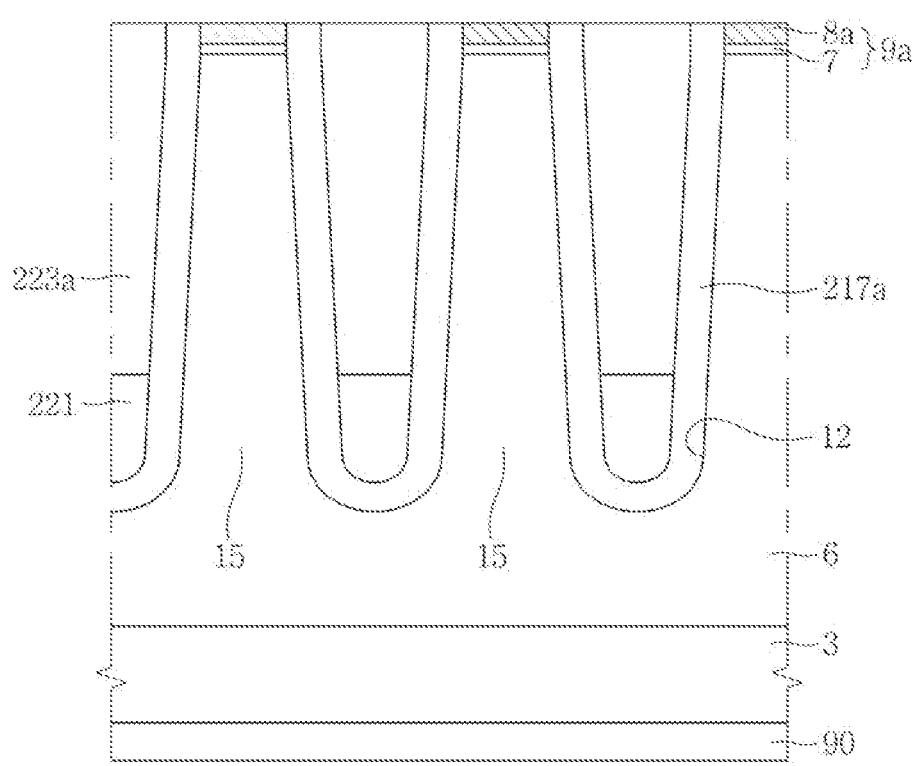

Referring to FIG. 37, an example method of forming the example embodiment of a semiconductor device in accordance with principles of inventive concepts may include forming a planarized auxiliary insulating layer 223a and a planarized lower insulating layer 217a by planarizing the auxiliary insulating layer 223 (shown in FIG. 36) and the lower insulating layer 117 (shown in FIG. 36).

The formation of the planarized auxiliary and lower insulating layers 223a and 217a may include planarizing the auxiliary insulating layer 223 (shown in FIG. 36) and the lower insulating layer 117 (shown in FIG. 36) by performing a planarization process until the first mask pattern 8a of the mask pattern 9a is exposed. The planarization process may include a CMP process. During the planarization process, the second mask pattern 8b of the mask pattern 9 may be removed, and, as a result, a mask pattern 9a whose thickness is reduced may be formed.

Figure 38:
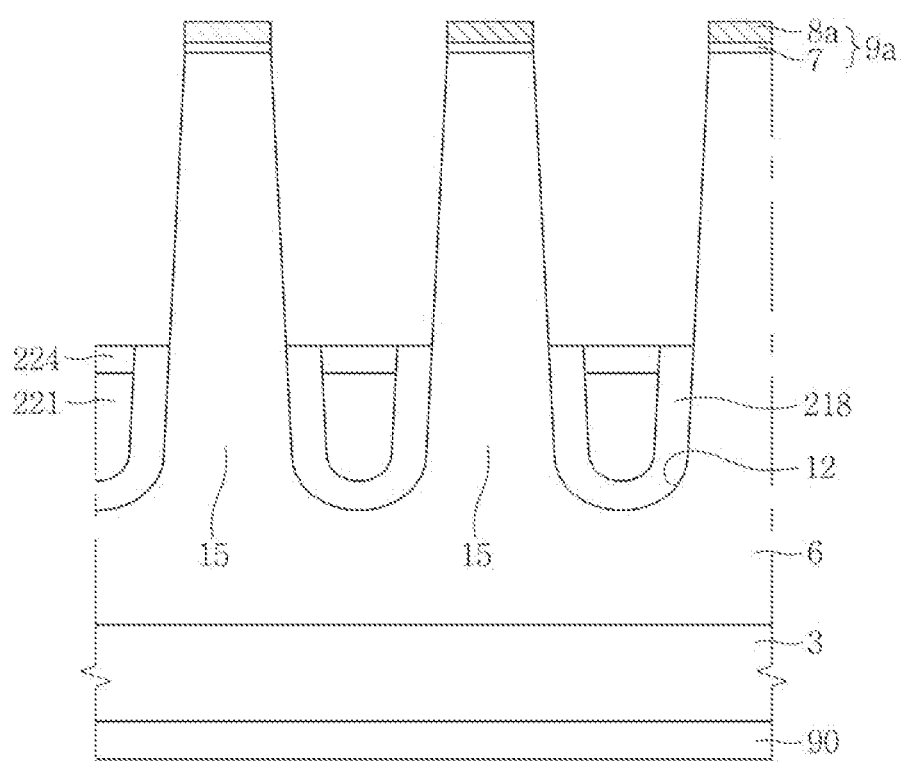

Referring to FIG. 38, an example method of forming the example embodiment of a semiconductor device in accordance with principles of inventive concepts may include forming an auxiliary insulating pattern 224 and a lower insulating pattern 218 by partially etching the planarized auxiliary insulating layer 223a (shown in FIG. 37) and the planarized lower insulating layer 217a (shown in FIG. 37). Since upper surfaces of the planarized auxiliary and lower insulating layers 223a and 217a (shown in FIG. 37) are substantially planar, upper surfaces of the auxiliary insulating pattern 224 and the lower insulating pattern 218 may be formed to be planar.

Figure 39:
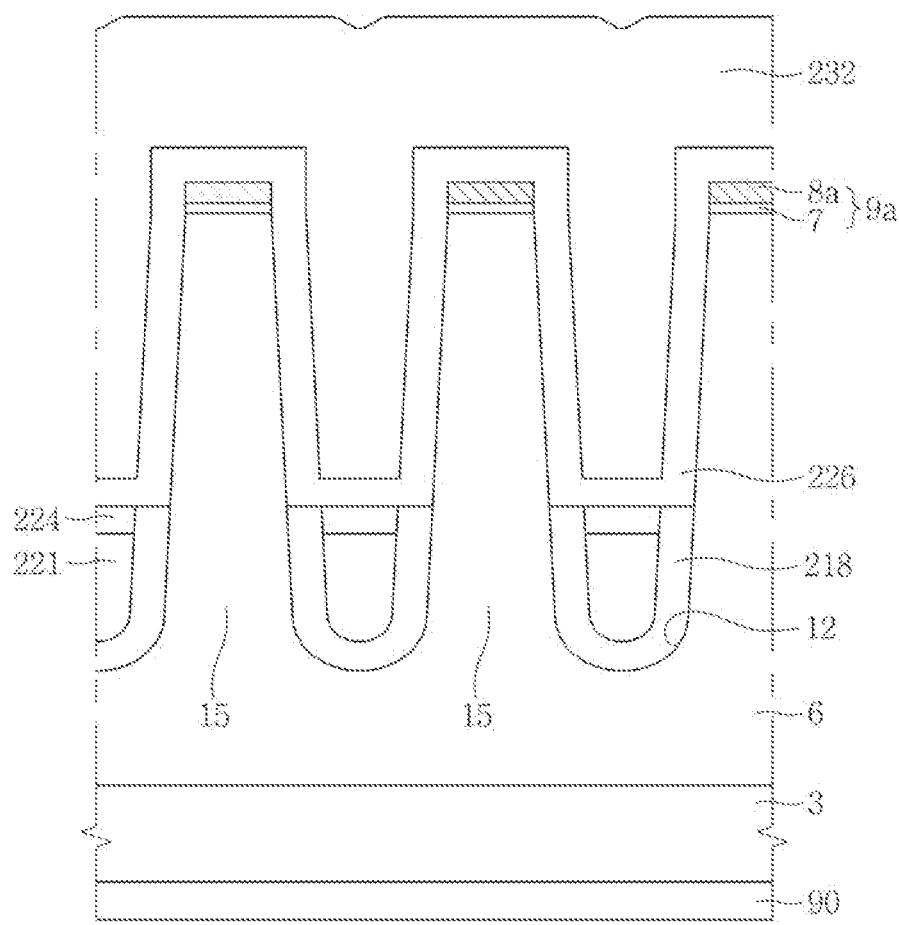

Referring to FIG. 39, an example method of forming the example embodiment of a semiconductor device in accordance with principles of inventive concepts may include conformally forming an intermediate insulating layer 226 over the semiconductor substrate 3 having the auxiliary insulating pattern 224 and the lower insulating pattern 218, and forming an upper conductive layer 232 on the intermediate insulating layer 226. The intermediate insulating layer 226 may be formed of an insulating material such as silicon oxide, or the like, and the upper conductive layer 232 may be farmed of a conductive material such as polysilicon, for example.

Figure 40:
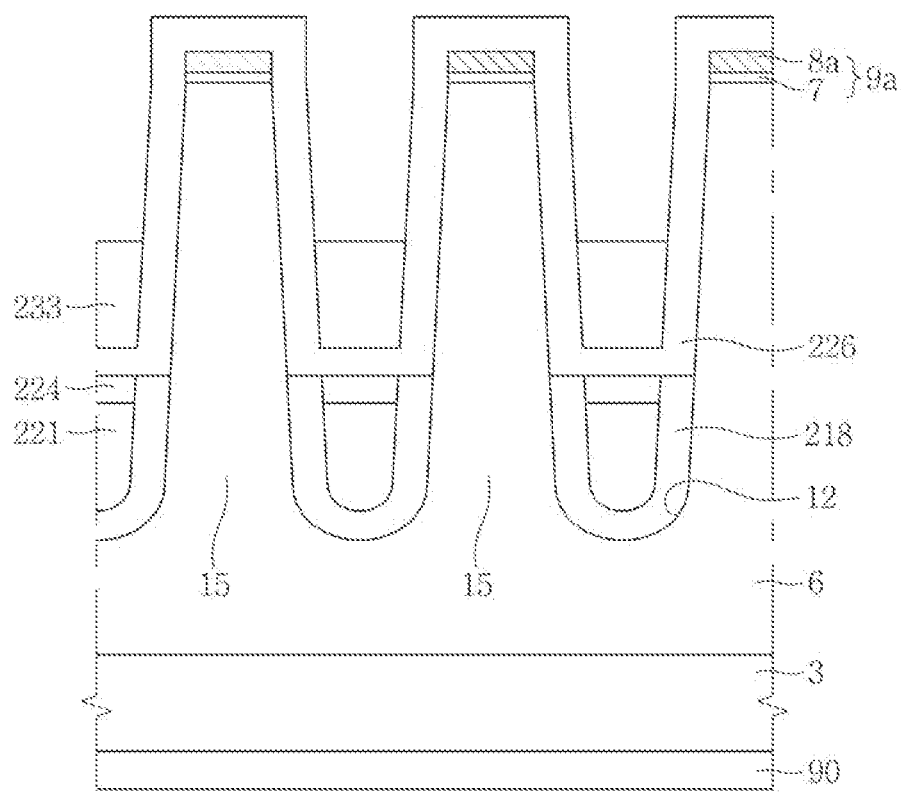

Referring to FIG. 40, an example method of forming the example embodiment of a semiconductor device in accordance with principles of inventive concepts may include forming an upper conductive pattern 233.

The formation of the upper conductive pattern 233 may include planarizing the upper conductive layer 232 (shown in FIG. 39) using the method described in FIG. 9 by performing a planarization process until the intermediate insulating layer 226 is exposed, and etching the planarized upper conductive layer using the method described in FIG. 10.

Figure 41:
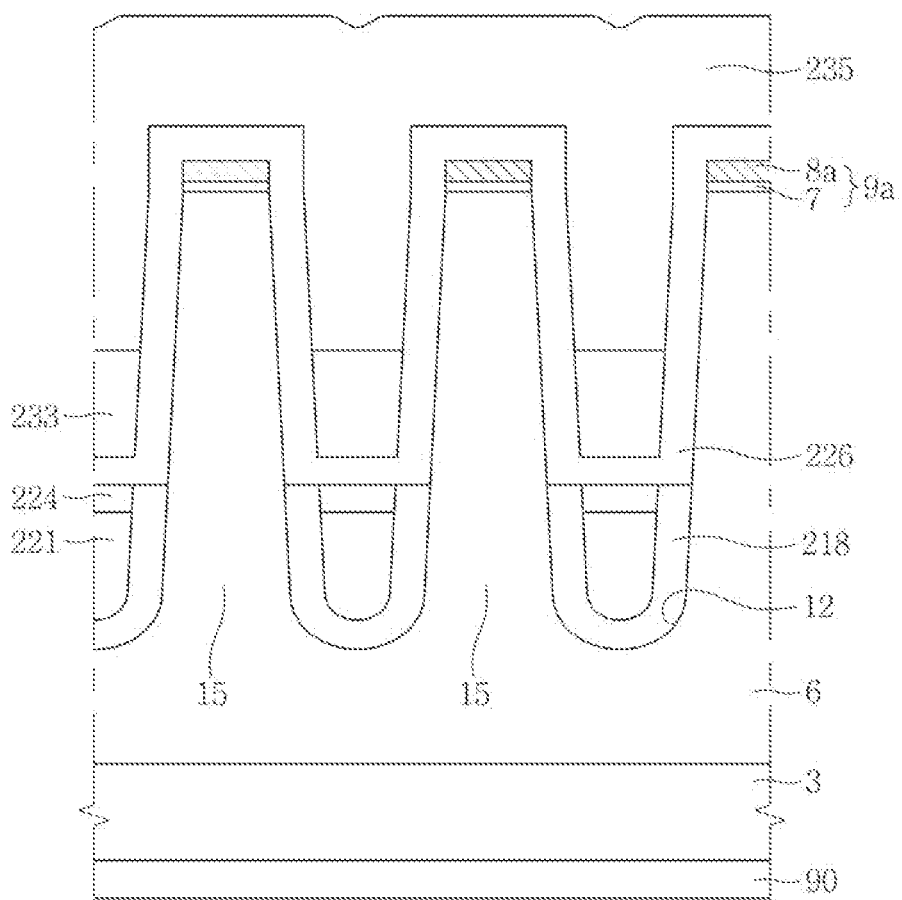

Referring to FIG. 41, an example method of forming the example embodiment of a semiconductor device in accordance with principles of inventive concepts may include forming an upper insulating layer 235 over the semiconductor substrate 3 having the upper conductive pattern 233. The upper insulating layer 235 may be formed of silicon oxide, for example.

Figure 42:
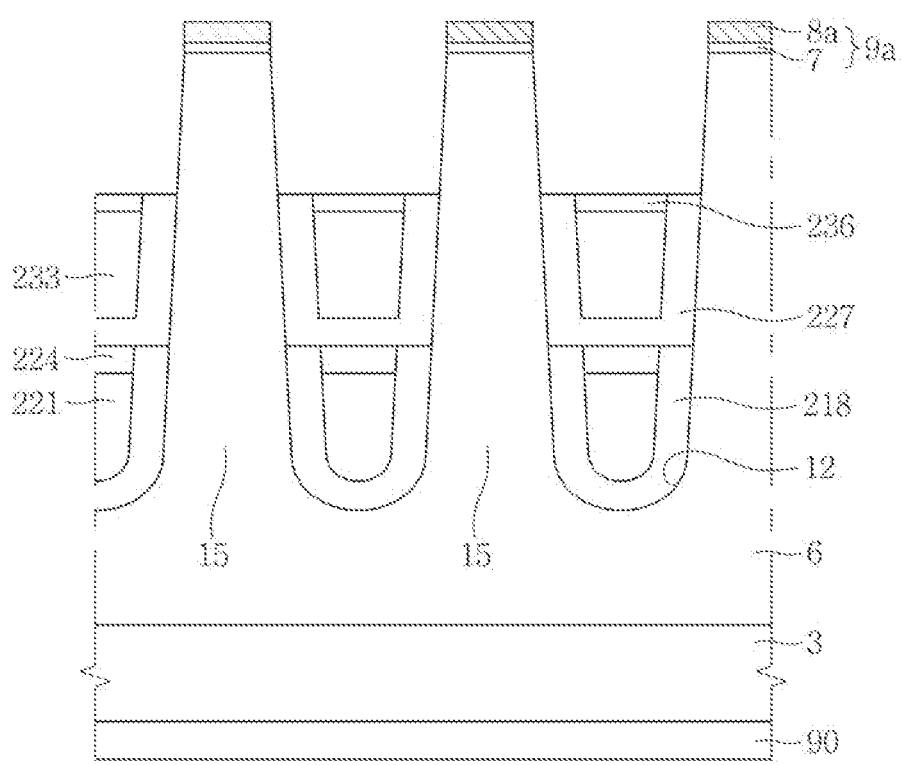

Referring to FIG. 42, an example method of forming the example embodiment of a semiconductor device in accordance with principles of inventive concepts may include forming a planarized upper insulating layer and a planarized intermediate insulating layer by planarizing the upper insulating layer 235 (shown in FIG. 41) and the intermediate insulating layer 226 (shown in FIG. 41) by performing a planarization process (e.g., a CMP process) until the first mask pattern 8a of the mask pattern 9a is exposed, and forming an upper insulating pattern 236 and an intermediate insulating pattern 227 by etching the planarized upper insulating layer and the planarized intermediate insulating layer.

Figure 43:
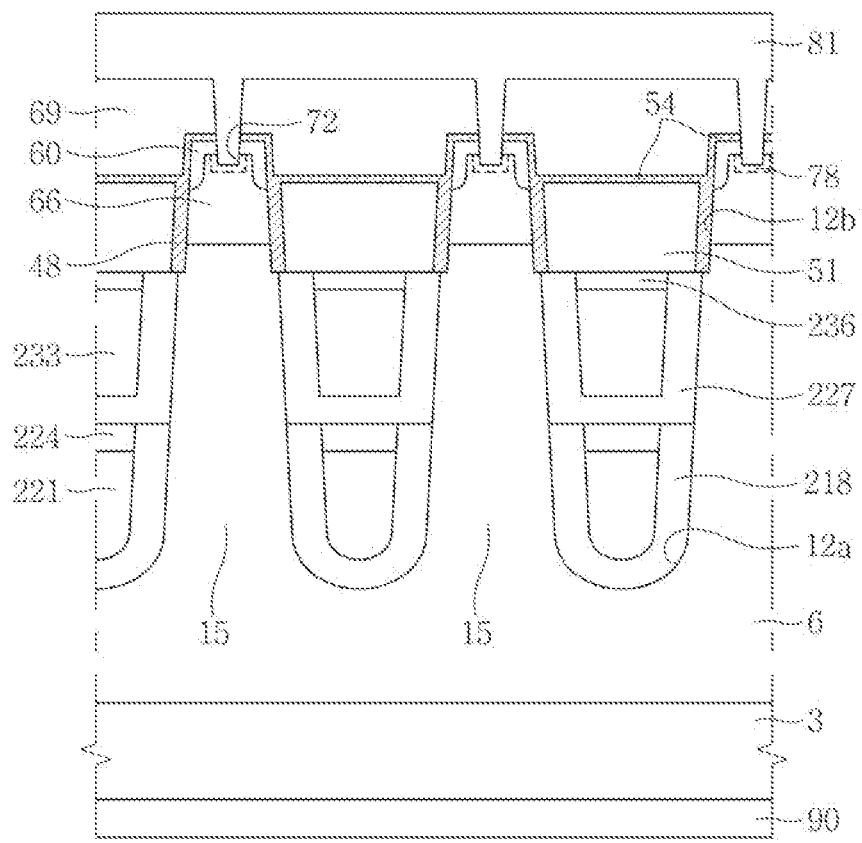

Referring to FIG. 43, an example method of forming the example embodiment of a semiconductor device in accordance with principles of inventive concepts may include forming a gate dielectric layer 48, a gate electrode 51, an insulating buffer layer 54, a source impurity region 60, a channel impurity region 66, an insulating capping layer 69, a groove region 72, a body contact impurity region 78, and a front-side conductive layer 81 by performing the same processes described in FIGS, 14A, 14B, and 15 to 25.

Referring again to FIG. 4, an example method of forming the example embodiment of a semiconductor device in accordance with principles of inventive concepts may include reducing a thickness of the semiconductor substrate 3 by grinding a back side of the semiconductor substrate 3, and forming a back-side conductive layer 90 on the back side of the semiconductor substrate 3. Therefore, the semiconductor device 200 described in FIG. 4 in accordance with an embodiment of the inventive concept may be formed.

Figure 44:
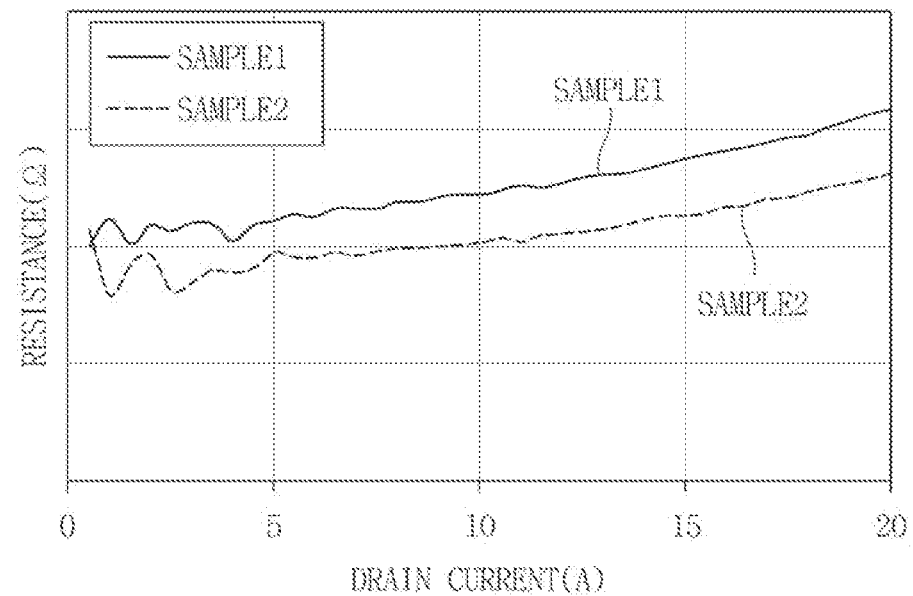
FIG. 44 is a diagram showing a resistance ("on" resistance) characteristic of a transistor configuring an example embodiment of a semiconductor device in accordance with principles of inventive concepts.

FIG. 44 is a diagram showing a resistance ("on" resistance) characteristic of an example embodiment of semiconductor device including transistor(s) in accordance with principles of inventive concepts.

In FIG. 44, Sample 1 includes all of the components except the conductive structure 21 (shown in FIG. 1) and the insulating structure 37 (shown in FIG. 1) among the components included in the semiconductor device 1 (shown in FIG. 1). Sample 2 is the semiconductor device 1 described in FIG. 1.

Sample 2 has the conductive structure 21 (shown in FIG. 1) completely surrounded by the insulating structure 37 (shown in FIG. 1), and Sample 1 has a conductive structure partially surrounded by the insulating structure. The conductive structure of Sample 1 may be grounded.

In FIG. 44, the resistance plotted on the vertical axis is a sum of the resistances of the source area, of the channel area, and of the drain area. The resistance of Sample 2, in accordance with principles of inventive concepts, is lower than that of Sample 1. This demonstrates that the resistance characteristic of a semiconductor device 1 including the conductive structure 21 (shown in FIG. 1) completely surrounded by the insulating structure 37 (shown in FIG. 1) is superior to that of the semiconductor device including a conductive structure that may be grounded and that, as a result, the performance of the semiconductor device 1 including the conductive structure 21 (shown in FIG. 1) completely surrounded by the insulating structure 37 (shown in FIG. 1) is superior to that of the semiconductor device including the conductive structure that may be grounded.

An electronic system 500 including semiconductor device in accordance with principles of inventive concepts will be described with reference to FIG. 45.

Figure 45:
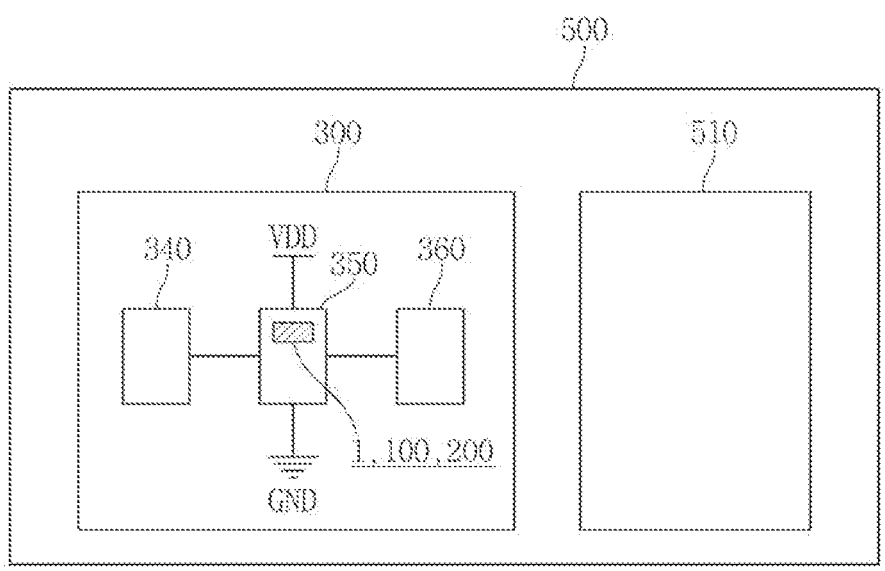
FIG. 45 is a block diagram showing an electronic system including an example embodiment of a semiconductor device in accordance with principles of inventive concepts.

Referring to FIG. 45, the electronic system 500 may include a controller 340, an electronic component 360, and a device 350 including a semiconductor device 1, 100, or 200 in accordance with principles of inventive concepts. The device 350, the controller 340, and the electronic component 360 may be disposed on a board 300, and electrically connected to each other.

The device 350 may include a power inverter or a DC-to-DC converter. The device 350 may be electrically connected to a ground terminal GND and a VDD terminal VDD. The device 350 may include a DC-to-DC converter including two NMOS transistors. The semiconductor device 1, 100, or 200 in accordance with principles of inventive concepts may be any one of the transistors included in the DC-to-DC converter, for example.

The controller 340 may be electrically connected to the device 350 and perform a command that turns on or off the device 350. The controller 340 may be electrically connected to the gate electrode of the semiconductor device 1, 100, or 200 in accordance with the inventive concept.

The electronic system 500 may include a display device 510. The display device 510 may be the display device of a computer system or a portable electronic device. For example, the display device 510 may be a monitor connected to a desk top computer or a monitor of a notebook PC, a display device of a tablet PC, a smart phone, a portable communication system, or a portable electronic system capable of Internet web surfing.

According to example embodiments in accordance with principles of inventive concepts, a semiconductor device employing a conductive structure completely surrounded by an insulating structure may be provided, which may improve the performance of the transistor in the semiconductor device.

The foregoing is illustrative of embodiments and is not to be construed as limiting thereof Although a few example embodiments have been described, those skilled in the art will readily appreciate that many modifications are possible without materially departing from the novel teachings and advantages. Accordingly, all such modifications are intended to be included within the scope of inventive concepts as defined in the claims. It is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming a semiconductor device, comprising:
   forming a first mask pattern and a second mask pattern, which are sequentially stacked on a semiconductor layer;
   forming trench regions configured to define an active region in the semiconductor layer by etching the semiconductor layer using the first and second mask patterns as etch masks;
   forming a lower insulating layer configured to cover the trench regions and the first and second mask patterns;
   forming a conductive structure configured to partially fill the trench region on the lower insulating layer;
   forming an upper insulating layer configured to fill the trench region over a substrate including the conductive structure;
   forming a planarized upper insulating layer and a planarized lower insulating layer by planarizing the upper insulating layer and the lower insulating layer until the first mask pattern is exposed;
   forming an upper insulating pattern and a lower insulating pattern by etching the planarized upper insulating layer and the planarized lower insulating layer;
   removing the first mask pattern; and
   forming a gate dielectric layer and a gate electrode on the lower and upper insulating patterns and in the trench region.

2. The method according to claim 1, wherein the forming of the conductive structure comprises:
   forming a conductive layer on the lower insulating layer;
   forming a planarized conductive layer by planarizing the conductive layer until the lower insulating layer located on the second mask pattern is exposed; and
   etching the planarized conductive layer.

3. The method according to claim 1, wherein the upper insulating pattern is formed to have a thickness greater than the lower insulating pattern.

4. The method according to claim 1, wherein the lower insulating pattern and the upper insulating pattern are formed to entirely surround the conductive structure.

5. The method according to claim 1, further comprising:
   forming an insulating buffer layer on the active region and the gate electrode;
   forming a source impurity region in the active region by performing a slant ion implantation process; and
   forming a channel impurity region having a conductive type different from the source impurity region in the active region,
   wherein the gate electrode is formed at a lower level than an upper surface of the active region, the source impurity region is formed at a higher level than the channel impurity region, and the channel impurity region has a part facing the gate electrode.

6. The method according to claim 5, further comprising:
   forming an insulating capping layer on the insulating buffer layer;
   forming a groove region;
   forming a body contact impurity region; and
   forming a front-side conductive layer configured to fill the groove region on the insulating capping layer,
   wherein the groove region passes through the insulating capping layer and the source impurity region, and is formed to extend into the channel impurity region, and the body contact impurity region is formed in a surface of the channel impurity region exposed by the groove region.

7. The method according to claim 1, further comprising:
forming a sacrificial oxide layer on a surface of the active region located at a higher level than the upper insulating pattern and the lower insulating pattern before the gate dielectric layer is formed; and
increasing the width of the trench region located at a higher level than the upper insulating pattern and the lower insulating pattern by removing the sacrificial oxide layer.

8. A method forming a semiconductor device, comprising:
forming a first mask pattern and a second mask pattern, which are sequentially stacked on a semiconductor layer;
forming trench regions configured to define an active region in the semiconductor layer by etching the semiconductor layer using the first and second mask patterns as etch masks;
forming a lower insulating layer configured to cover the trench regions and the first and second mask patterns;
forming a lower conductive pattern configured to partially fill the trench region on the lower insulating layer;
etching the lower insulating layer located at a higher level than the lower conductive pattern;
forming an intermediate insulating layer over a substrate having the lower conductive pattern and the etched lower insulating layer;
forming an upper conductive pattern configured to partially fill the trench region on the intermediate insulating layer;
forming an upper insulating layer over the substrate having the upper conductive pattern;
forming a planarized upper insulating layer and a planarized lower insulating layer by planarizing the upper insulating layer and the lower insulating layer until the first mask pattern is exposed;
forming an upper insulating pattern and the lower insulating pattern by etching the planarized upper insulating layer and the planarized lower insulating layer;
removing the first mask pattern; and
forming a gate dielectric layer and a gate electrode on the lower and upper insulating patterns and in the trench region.

9. The method according to claim 8, wherein the forming of the lower conductive pattern comprises:
forming a lower conductive layer on the lower insulating layer;
forming a planarized lower conductive layer by planarizing the lower conductive layer until the lower insulating layer located on the second mask pattern is exposed; and
etching the planarized lower conductive layer.

10. The method according to claim 8, wherein the second mask pattern is etched and removed together with the lower insulating layer while etching the lower insulating layer.

11. The method according to claim 8, wherein the forming of the upper conductive pattern comprises:
forming an upper conductive layer on the intermediate insulating layer;
forming a planarized upper conductive layer by planarizing the upper conductive layer until the intermediate insulating layer located on the first mask pattern is exposed; and
etching the planarized upper conductive layer.

12. The method according to claim 8, further comprising:
forming an auxiliary insulating layer configured to fill the trench region over the substrate having the lower conductive pattern before the lower insulating layer is etched;
forming a planarized auxiliary insulating layer and a planarized lower insulating layer by planarizing the auxiliary insulating layer and the lower insulating layer until the first mask pattern is exposed; and
forming an auxiliary insulating pattern and a lower insulating pattern by etching the planarized auxiliary insulating layer and the planarized lower insulating layer.

13. The method according to claim 8, wherein the distance between the lower conductive pattern and the upper conductive pattern is greater than the distance between the bottom of the lower conductive pattern and the bottom of the trench region, and the distance between the upper conductive pattern and the gate electrode.

14. The method according to claim 8, further comprising:
forming a source impurity region in the active region; and
forming a channel impurity region in the active region under the source impurity region.

15. The method according to claim 14, further comprising:
forming an insulating capping layer over the substrate having the source impurity region and the channel impurity region;
forming a groove region configured to pass through the insulating capping layer and source impurity region, and extend into the channel impurity region;
forming a body contact impurity region in a surface of the channel impurity region exposed by the groove region; and
forming a front-side conductive layer configured to fill the groove region on the insulating capping layer.

16. A split gate trench field effect transistor, comprising:
a trench disposed in a semiconductor substrate to define an active region;
a gate electrode formed in the trench;
a gate dielectric layer interposed between the gate electrode and the active region;
a shield gate formed in the trench below the gate electrode;
an insulating structure surrounding the shield gate and thereby electrically floating the shield gate;
an insulating capping layer disposed on the gate electrode and the active region; and
an insulating buffer layer interposed between the insulating capping layer and the active region and between the insulating capping layer and the gate electrode, wherein the insulating buffer layer is thinner than the gate dielectric layer.

17. The transistor of claim 16 wherein the distance between the bottom of the gate electrode and the top of the shield gate is greater than the distance between the bottom of the shield gate and the bottom of the trench in which it is formed.

18. The transistor of claim 16 wherein the shield gate includes upper and lower conductive patterns surrounded by an insulating structure.

19. A DC-to-DC converter including the transistor of claim 16.

20. An electronic system including the DC-to-DC converter of claim 19.

* * * * *